US011476880B2

(12) United States Patent
Yamamoto

(10) Patent No.: US 11,476,880 B2
(45) Date of Patent: Oct. 18, 2022

(54) RADIO FREQUENCY MODULE

(71) Applicant: Murata Manufacturing Co., Ltd., Kyoto (JP)

(72) Inventor: Michiyo Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/061,093

(22) Filed: Oct. 1, 2020

(65) Prior Publication Data
US 2021/0021291 A1 Jan. 21, 2021

Related U.S. Application Data

(63) Continuation of application No. PCT/JP2019/001839, filed on Jan. 22, 2019.

(30) Foreign Application Priority Data

Apr. 5, 2018 (JP) .............................. JP2018-073351

(51) Int. Cl.
H04B 1/10 (2006.01)
(52) U.S. Cl.
CPC ... *H04B 1/1027* (2013.01); *H04B 2001/1072* (2013.01)
(58) Field of Classification Search
CPC ......... H04B 1/1027; H04B 2001/1072; H04B 1/10; H04B 2001/1045; H04B 1/0057; H04B 1/18; H03H 9/72
See application file for complete search history.

(56) References Cited

U.S. PATENT DOCUMENTS

| 4,292,596 | A | 9/1981 | Ishizuka et al. |
| 7,564,275 | B2* | 7/2009 | Bien ........................ H02M 1/38 327/108 |
| 10,211,863 | B1* | 2/2019 | Grens ................... H03G 3/3052 |
| 2003/0053182 | A1* | 3/2003 | Dupas ................... H04L 25/062 398/202 |

(Continued)

FOREIGN PATENT DOCUMENTS

| JP | S5525209 A | 2/1980 |
| JP | 2003179521 A | 6/2003 |

(Continued)

OTHER PUBLICATIONS

International Search Report issued in Application No. PCT/JP2019/001839, dated Feb. 26, 2019.

(Continued)

*Primary Examiner* — Nguyen T Vo
(74) *Attorney, Agent, or Firm* — Pearne & Gordon LLP

(57) ABSTRACT

A radio frequency module includes a filter that is arranged on a first path connecting a common terminal and a first input/output terminal and has a first frequency band as a pass band, another filter that is arranged on a second path connecting the common terminal and a second input/output terminal and has a second frequency band different from the first frequency band as a pass band, and a detection circuit connected to the first path and configured to detect a leakage signal in the second frequency band leaked to the first path and output a signal indicating a detection result.

18 Claims, 16 Drawing Sheets

(56) References Cited

U.S. PATENT DOCUMENTS

| | | | |
|---|---|---|---|
| 2004/0152429 A1* | 8/2004 | Haub | H04B 1/1027 455/102 |
| 2009/0004987 A1* | 1/2009 | Akahori | H04B 1/18 455/251.1 |
| 2009/0232189 A1* | 9/2009 | Junell | H04B 1/713 375/137 |
| 2010/0009646 A1* | 1/2010 | Mevel | H03G 3/3068 455/234.1 |
| 2010/0022207 A1 | 1/2010 | Ogawa | |
| 2010/0240324 A1 | 9/2010 | Okada | |
| 2013/0033327 A1 | 2/2013 | Kadoi et al. | |
| 2016/0072443 A1 | 3/2016 | Mizokami | |
| 2018/0091241 A1 | 3/2018 | Kuttner | |

FOREIGN PATENT DOCUMENTS

| | | |
|---|---|---|
| JP | 20070104141 A | 4/2007 |
| JP | 2008054260 A | 3/2008 |
| JP | 2010226298 A | 10/2010 |
| JP | 2013038531 A | 2/2013 |
| JP | 2016058871 A | 4/2016 |
| WO | 2008015898 A1 | 2/2008 |

OTHER PUBLICATIONS

Written Opinion issued in Application No. PCT/JP2019/001839, dated Feb. 26, 2019.

\* cited by examiner

FIRST FREQUENCY BAND
Center: 50 Ω

SECOND FREQUENCY BAND
Center: 50 Ω

US 11,476,880 B2

RADIO FREQUENCY MODULE

CROSS REFERENCE TO RELATED APPLICATIONS

This is a continuation of International Application No. PCT/JP2019/001839 filed on Jan. 22, 2019 which claims priority from Japanese Patent Application No. 2018-073351 filed on Apr. 5, 2018. The contents of these applications are incorporated herein by reference in their entireties.

BACKGROUND

The present disclosure relates to a radio frequency module.

A radio frequency reception circuit that processes a received signal received by an antenna extracts a signal in a desired frequency band from the received signal by a filter, and amplifies the signal in the desired frequency band by a low noise amplifier (LNA). Such a circuit is required to improve reception sensitivity regarding demodulation of the signal in a radio frequency signal integrated circuit (RFIC) or the like connected to a subsequent stage of the circuit, for example.

As a method for achieving this requirement, a method as disclosed in Japanese Unexamined Patent Application Publication No. 2008-54260, in which part of the signal extracted by the filter is detected by a signal detector, and the gain and the like of the LNA are controlled in response to a signal level is conceivable. The technique disclosed in Japanese Unexamined Patent Application Publication No. 2008-54260 is used for a purpose of preventing destruction of the LNA when inputting a large power signal, but can also be used for a purpose of improving the reception sensitivity as described above. By improving the reception sensitivity, it is possible to improve the communication accuracy of a communication device including the radio frequency reception circuit.

In recent years, in a communication device, such as a mobile phone terminal, there has been a demand for supporting multi-band transmission and reception of radio frequency signals in a plurality of frequency bands with one terminal, and a radio frequency module has been developed in which respective one input/output terminals of a plurality of filters having different pass bands from each other, in other words, a plurality of paths, are commonly connected, on an antenna side, for example. The technique disclosed in Japanese Unexamined Patent Application Publication No. 2008-54260 is also applicable to such a radio frequency module. For example, in one path in a radio frequency module, a detection circuit that detects a change in a signal level of a main signal processed in the one path (a signal corresponding to a pass band of a filter provided in the one path) is provided. Accordingly, even when a signal that should have passed through the one path leaks to another path, an amplifier circuit provided in the one path is controlled according to the change, and thus it is possible to compensate the loss due to the signal leakage. By compensating the loss as described above, it is possible to improve the communication accuracy of the communication device including the radio frequency module.

However, the detection circuit provided in the one path performs the above detection by using part of the main signal processed in the one path, and thus there is a concern that loss may occur in the main signal or noise may occur when the loss due to the signal leakage is compensated.

BRIEF SUMMARY

According to a radio frequency module and the like according to the present disclosure, when compensating the loss due to a signal leakage in one path out of a plurality of commonly connected paths to another path, it is possible to use a signal in the other path instead of a signal in the one path, and thus it is possible to suppress the occurrence of loss and noise in the one path.

A radio frequency module according to an aspect of the present disclosure includes: a first filter that is arranged on a first path connecting a common terminal and a first input/output terminal and has a first frequency band as a pass band, a second filter that is arranged on a second path connecting the common terminal and a second input/output terminal and has a second frequency band different from the first frequency band as a pass band, and a first detection circuit that is connected to the first path, and configured to detect a leakage signal in the second frequency band leaked to the first path, and output a signal indicating a detection result.

Other features, elements, characteristics and advantages of the present disclosure will become more apparent from the following detailed description of embodiments of the present disclosure with reference to the attached drawings.

DETAILED DESCRIPTION

Hereinafter, embodiments of the present disclosure will be described in detail with reference to the accompanying drawings. It should be noted that the embodiments described below represent comprehensive or specific examples. Numerical values, shapes, materials, constituent elements, arrangement and connection forms of the constituent elements, and the like illustrated in the following embodiments are mere examples and are not intended to limit the present disclosure. Among the constituent elements in the following embodiments, constituent elements that are not described in the independent claims are described as optional constituent elements. Further, in each drawing, the same reference symbols are given to substantially the same configuration, and redundant description may be omitted or simplified in some cases. In addition, in the following embodiments, the term "connected" includes not only a case of being directly connected, but also a case of being electrically connected via another element or the like.

Embodiment 1

1. Configuration of Radio Frequency Module

First, a configuration of a radio frequency module according to Embodiment 1 will be described.

Figure 1:
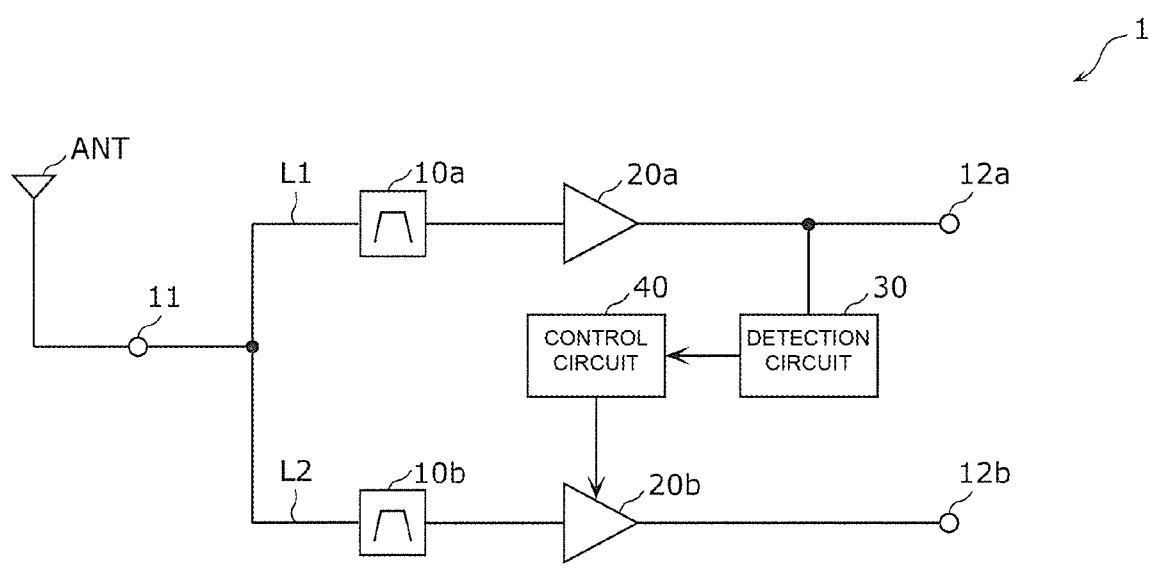
FIG. 1 is a configuration diagram illustrating a radio frequency module according to Embodiment 1.

FIG. 1 is a configuration diagram illustrating a radio frequency module 1 according to Embodiment 1. Note that FIG. 1 also illustrates an antenna element ANT in addition to the radio frequency module 1. The radio frequency module 1 includes filters 10a and 10b, amplifier circuits 20a and 20b, a detection circuit 30, and a control circuit 40.

The filter 10a is a first filter that is arranged on a path L1 (first path) connecting a common terminal 11 and an input/output terminal 12a (first input/output terminal) and has a first frequency band as a pass band. The filter 10b is a second filter that is arranged on a path L2 (second path) connecting the common terminal 11 and an input/output terminal 12b (second input/output terminal) and has a second frequency band different from the first frequency band as a pass band. The filters 10a and 10b are, for example, band pass filters configured by acoustic wave filters. Note that the filters 10a and 10b are not limited to the acoustic wave filters, and may be configured by other filters (LC filters or the like). The filters 10a and 10b are not limited to the band pass filters, and may be low pass filters, high pass filters, band elimination filters, or the like.

The antenna element ANT is connected to the common terminal 11 via, for example, a switch circuit or the like (not illustrated). The antenna element ANT is a multi-band antenna for transmitting and receiving radio frequency signals conforming to a communication standard, such as Long Term Evolution (LTE). Although not illustrated, a radio frequency integrated circuit (RFIC) is connected to the input/output terminals 12a and 12b, for example. Which of the filters 10a and 10b is used for communication is controlled by, for example, the RFIC. For example, carrier aggregation (CA) in which communication using the first frequency band and communication using the second frequency band are performed simultaneously may be performed.

The amplifier circuit 20a is a second amplifier circuit arranged in the path L1, and amplifies a signal in the first frequency band passing through the filter 10a. The amplifier circuit 20a is arranged, for example, between the filter 10a and the input/output terminal 12a in the path L1. The amplifier circuit 20b is a first amplifier circuit arranged in the path L2, and amplifies a signal in the second frequency band passing through the filter 10b. The amplifier circuit 20b is arranged, for example, between the filter 10b and the input/output terminal 12b in the path L2. When the radio frequency module 1 is used for transmission, the amplifier circuits 20a and 20b are circuits including power amplifiers (PAs). When the radio frequency module 1 is used for reception, the amplifier circuits 20a and 20b are circuits including low noise amplifiers (LNAs). In the present embodiment, the radio frequency module 1 is used for reception, for example, and the amplifier circuits 20a and 20b are circuits including the LNAs. Specific examples of the amplifier circuits 20a and 20b will be described later with reference to FIGS. 8 to 11.

The detection circuit 30 is a first detection circuit connected to the path L1, detects a leakage signal in the second frequency band leaking to the path L1, and outputs a signal indicating a detection result. Note that the leakage signal in the second frequency band leaked to the path L1 refers to a signal in the second frequency band that should originally flow from the common terminal 11 to the path L2 but has entered the path L1 without necessarily flowing through the path L2. Hereinafter, the reason why the detection circuit 30 is provided in the radio frequency module 1 will be described.

In recent years, there has been a demand for supporting multi-band transmission and reception of radio frequency signals in a plurality of frequency bands with one terminal. In the radio frequency module 1, respective one input/output terminals of a plurality of filters having different pass bands from each other (filters 10a and 10b in this case), in other words, a plurality of paths (paths L1 and L2 in this case) are commonly connected at the common terminal 11. Therefore, the signal in the second frequency band (the signal corresponding to the pass band of the filter 10b) processed in the path L2 leaks to the path L1 connected in common with the path L2. Similarly, the signal in the first frequency band (the signal corresponding to the pass band of the filter 10a) processed in the path L1 leaks to the path L2 connected in common with the path L1. Here, the signal in the second frequency band leaking to the path L1 will be referred to as a leakage signal, and the leakage signal in the second frequency band will be focused and described.

When the signal in the second frequency band leaks to the path L1, loss corresponding to the leaked amount occurs in the signal in the second frequency band. Accordingly, it is possible to compensate the loss by controlling the amplifier circuit 20b arranged in the path L2 according to the change in the signal in the second frequency band. Specifically, the amount of signal in the second frequency band passing through the path L2 changes (decreases) as much as the signal in the second frequency band leaked to the path L1. Therefore, when the change is detected, the loss of the leakage can be compensated by controlling the gain and the like of the amplifier circuit 20b according to the loss of the leakage.

As a method for detecting the change in the signal in the second frequency band passing through the path L2, a method for directly detecting the change by connecting a detection circuit for detecting the change in the signal in the second frequency band passing through the path L2 to the path L2 may be conceivable. However, in this method, the detection circuit provided in the path L2 performs the detection by using part of the signal (main signal) in the second frequency band processed in the path L2, so that further loss or noise may occur in the main signal. That is, different loss occurs in order to compensate the loss due to the signal leakage.

On the other hand, in the present embodiment, the detection circuit 30 for detecting the change in the signal in the second frequency band is connected to the path L1. In the path L1, the detection circuit 30 indirectly detects the change instead of directly detecting the change in the path L2. Specifically, the detection circuit 30 detects the change by detecting the leakage signal in the second frequency band leaked to the path L1. Since the magnitude of the leakage signal in the path L1 correlates with the change in the signal in the second frequency band in the path L2, the detection circuit 30 can detect the change by detecting the leakage signal. Further, since the first frequency band and the second frequency band are different from each other, the leakage signal in the second frequency band can be easily detected in the path L1 through which the signal in the first frequency band passes by distinguishing the leakage signal in the second frequency band from the signal in the first frequency band. As described above, since it is not necessary to connect the detection circuit 30 for detecting the change in the signal in the second frequency band to the path L2, it is possible to suppress the occurrence of the loss and the noise due to the detection circuit 30 in the path L2. That is, it is possible to suppress the occurrence of the loss and the noise in the path L2.

Since the loss can be compensated in the radio frequency module 1, the SN characteristics can be favorably maintained, and the signal can be easily demodulated by the RFIC or the like connected to a subsequent stage of the radio frequency module 1.

Further, as a method for compensating the loss due to the signal leakage, there are methods for synthesizing another signal or adjusting the phase of the signal, but the circuit configuration becomes complicated when these methods are applied. On the other hand, in the present disclosure, it is possible to compensate the loss due to the signal leakage with the simple configuration in which only the detection circuit 30 is provided.

The detection circuit 30 is connected, for example, between the amplifier circuit 20a and the input/output terminal 12a in the path L1. As a result, the leakage signal is also amplified by the amplifier circuit 20a, so that the detection circuit 30 can easily detect the leakage signal. Note that, depending on frequency characteristics of the amplifier circuit 20a, the leakage signal in the second frequency band may not be correctly amplified. Therefore, the detection circuit 30 may be connected between the filter 10a and the amplifier circuit 20a or may be connected between the common terminal 11 and the filter 10a in the path L1.

The detection circuit 30 is intended to detect a leakage signal in the second frequency band, and has a configuration that does not detect a signal in the first frequency band as much as possible. That is, the detection circuit 30 is a circuit that selectively detects the leakage signal in the second frequency band, in other words, distinguishes between the signal in the first frequency band and the signal in the second frequency band, and mainly detects the leakage signal in the second frequency band. Specific examples of the configuration of the detection circuit 30 will be described later with reference to FIGS. 2 to 7.

The control circuit 40 is a circuit that controls the amplifier circuit 20b based on the signal indicating the detection result output from the detection circuit 30. For example, the control circuit 40 is an AD conversion circuit, acquires an analog signal as the signal indicating the detection result from the detection circuit 30, converts the analog signal into a digital signal, and controls the amplifier circuit 20b by using the digital signal. For example, the control circuit 40 may be a microprocessor (microcomputer) or the like. Note that the control circuit 40 is provided separately from the amplifier circuit 20b, but may be provided in the amplifier circuit 20b. Further, the radio frequency module 1 may not include the control circuit 40, and for example, the control circuit 40 may be included in the RFIC.

2. Specific Examples of Detection Circuit

Next, specific examples of the detection circuit 30 will be described with reference to FIGS. 2 to 7.

Figure 2:
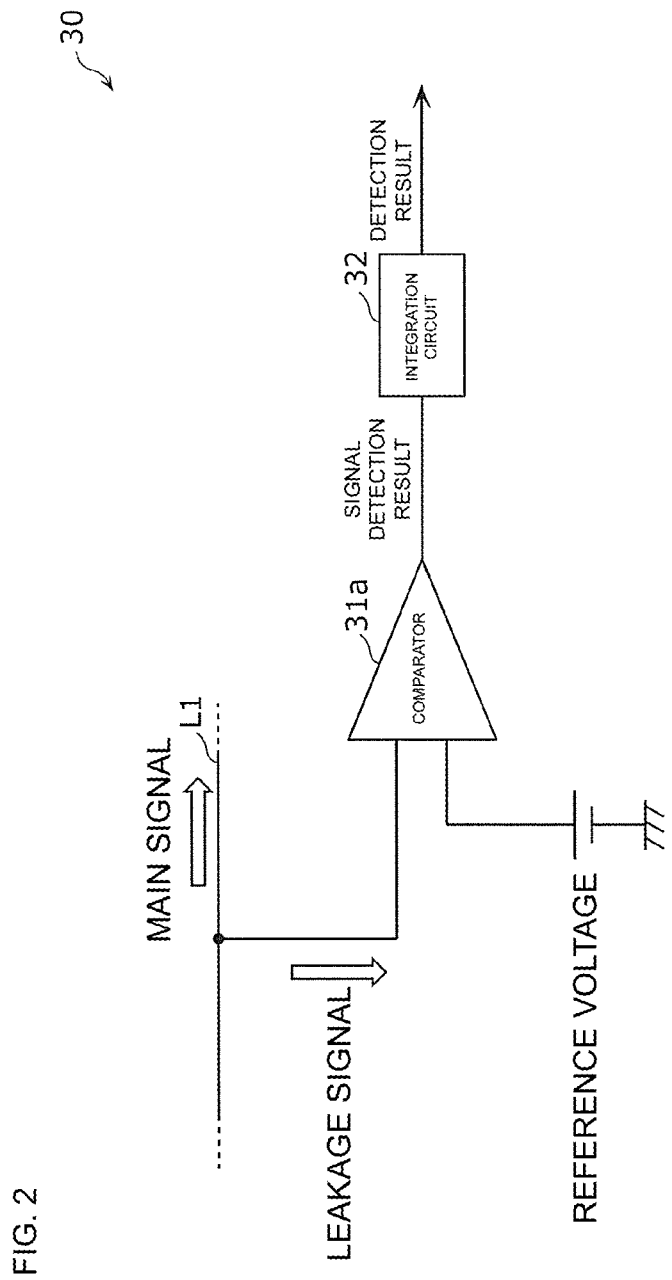
FIG. 2 is a configuration diagram illustrating Example 1 of a first detection circuit according to Embodiment 1.

FIG. 2 is a configuration diagram illustrating Example 1 of the first detection circuit (detection circuit 30) according to Embodiment 1.

The detection circuit 30 includes, for example, a comparator 31a and an integration circuit 32.

The comparator 31a is a signal detection circuit which receives a leakage signal and detects the input leakage signal. The comparator 31a receives the leakage signal and a reference voltage, and outputs a signal indicating a comparison result between a voltage indicated by the leakage signal and the reference voltage as a signal indicating a signal detection result. For example, the leakage signal is input to a positive input terminal of the comparator 31a and the reference voltage is input (applied) to a negative input terminal of the comparator 31a. Accordingly, during a period in which the voltage indicated by the leakage signal is larger than the reference voltage, a signal having a positive voltage is output as the signal indicating the comparison result from the comparator 31a, and during a period in which the voltage indicated by the leakage signal is smaller than the reference voltage, a signal indicating 0 is output as the signal indicating the comparison result from the comparator 31a. As described above, by using the comparator 31a, it is possible to easily detect the leakage signal.

The reference voltage is determined, for example, based on a comparison result output from the comparator 31a when a leakage signal is not input to the comparator 31a. Specifically, the reference voltage is determined such that the signal indicating the comparison result output from the comparator 31a is 0 when the leakage signal is not input to the comparator 31a.

The integration circuit 32 is a circuit that integrates the signal indicating the signal detection result in the signal detection circuit (comparator 31a) and outputs a signal obtained by the integration as a signal indicating a detection result. That is, the integration circuit 32 is a circuit that smooths the output of the comparator 31a and converts a smoothed output into a direct current signal. By integrating the signal indicating the signal detection result in the comparator 31a, the detection circuit 30 can output the direct current signal as the signal indicating the detection result. That is, since the signal indicating the detection result becomes the direct current signal and easy to process, it becomes easy to control using the signal indicating the detection result (for example, the control of the amplifier circuit 20b by the control circuit 40). Note that the integration circuit 32 is, for example, a circuit including a capacitor, an LC circuit, or the like connected between the signal path and the ground, but is not particularly limited as long as it is the integration circuit.

Figure 3:
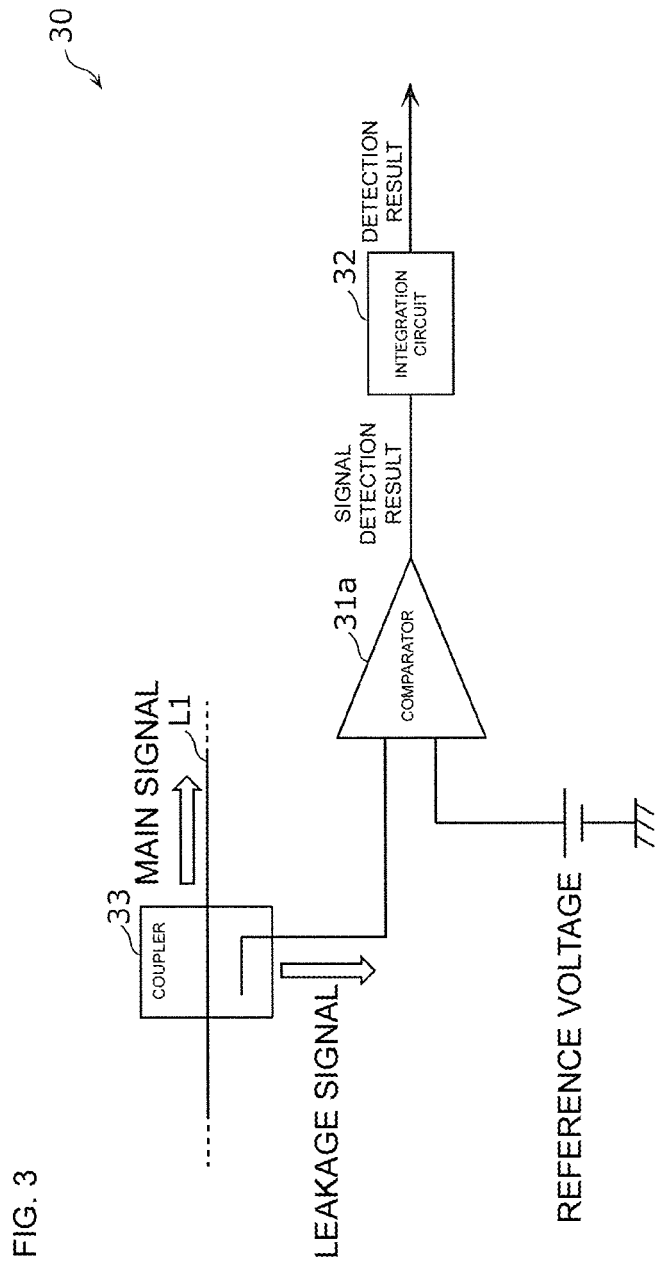
FIG. 3 is a configuration diagram illustrating Example 2 of the first detection circuit according to Embodiment 1.

FIG. 3 is a configuration diagram illustrating Example 2 of the first detection circuit (detection circuit 30) according to Embodiment 1. In Example 2, the detection circuit 30 further includes a coupler 33 as compared with Example 1.

The coupler 33 is a circuit that extracts a leakage signal from the path L1. Since the coupler 33 can extract a signal in a specific frequency, by using the coupler 33, it becomes easy to extract only the leakage signal (the signal in the second frequency band) without necessarily extracting the signal in the first frequency band, which is the main signal in the path L1. Accordingly, the signal in the first frequency band is not extracted by the coupler 33, and only the leakage signal is easily extracted. Therefore, the signal detection circuit (the comparator 31a) can easily detect the leakage signal. In addition, the signal in the first frequency band is less likely to be input to the detection circuit 30 due to the coupler 33. Therefore, it is possible to suppress the occurrence of the loss and the noise due to the detection circuit 30 for the signal in the first frequency band which is the main signal in the path L1. That is, it is possible to suppress the occurrence of the loss in the signal in the first frequency band due to the detection circuit 30 connected to the path L1 for detecting the leakage signal in the second frequency band.

Note that, in FIGS. 4, 5, and 7 below, examples in which the detection circuit 30 does not include the coupler 33 will be described. Even when the coupler 33 is not provided, it is possible to extract the leakage signal, for example, by adjusting the frequency characteristics of the comparator 31a to correspond to the second frequency band, and adjusting the impedance of a path in which the detection circuit 30 is provided (path branching from the path L1) so as to be matched in the second frequency band, as will be described later.

Figure 4:
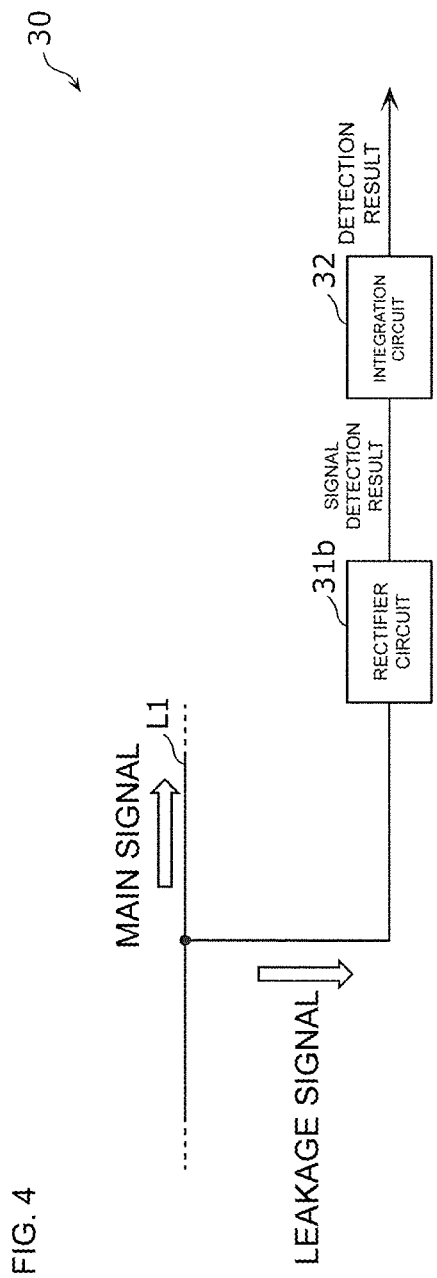
FIG. 4 is a configuration diagram illustrating Example 3 of the first detection circuit according to Embodiment 1.

FIG. 4 is a configuration diagram illustrating Example 3 of the first detection circuit (detection circuit 30) according to Embodiment 1. A rectifier circuit 31b is a signal detection circuit that rectifies the input leakage signal, and outputs a signal obtained by the rectification as the signal indicating the signal detection result. That is, in Example 3, the detection circuit 30 includes, as the signal detection circuit, the rectifier circuit 31b instead of the comparator 31a.

The rectifier circuit 31b is, for example, a diode bridge full-wave rectifier circuit, and rectifies both positive and negative waves in the leakage signal. For example, the rectifier circuit 31b detects a leakage signal by rectifying the leakage signal to a positive signal. By using the rectifier circuit 31b, it is possible to easily detect the leakage signal. Further, since the rectifier circuit 31b is simply configured by diodes, loads, and the like, the signal detection circuit can be reduced in size. Note that, in FIGS. 5 to 7 below, examples in which the signal detection circuit is the comparator 31a will be described.

Figure 5:
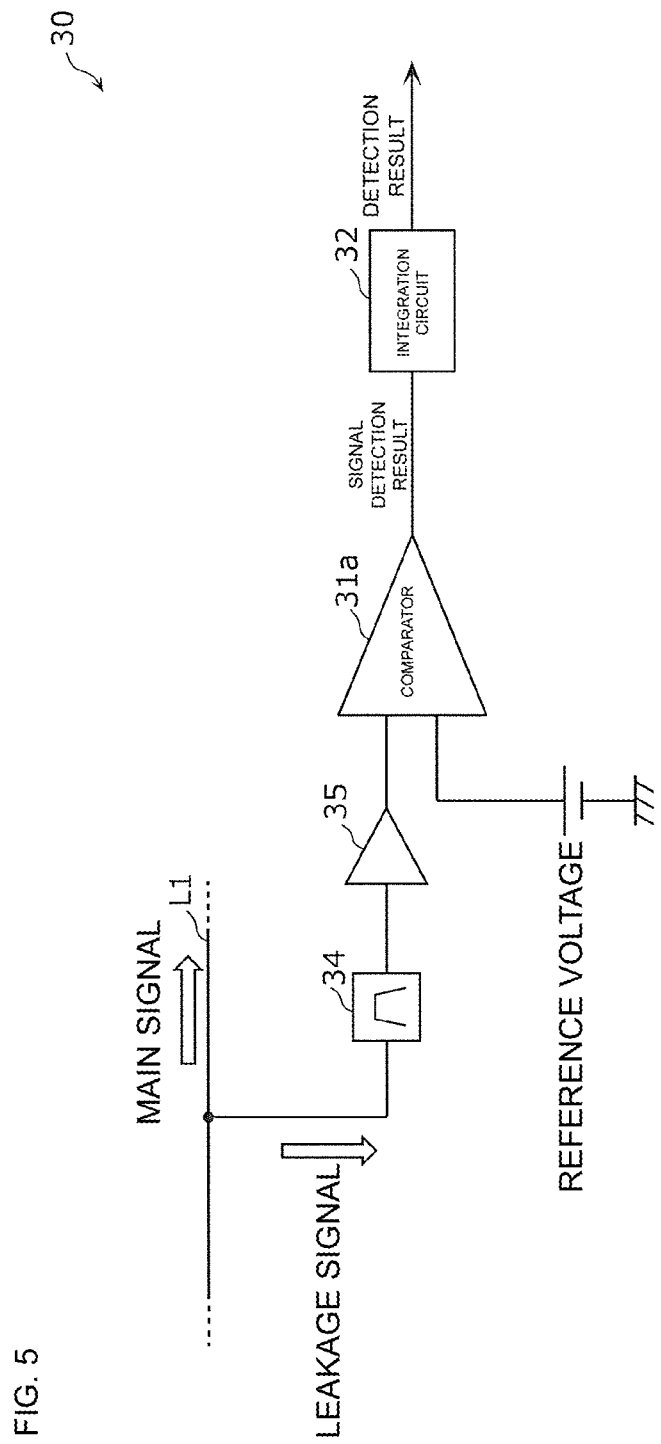
FIG. 5 is a configuration diagram illustrating Example 4 of the first detection circuit according to Embodiment 1.

FIG. 5 is a configuration diagram illustrating Example 4 of the first detection circuit (detection circuit 30) according to Embodiment 1.

In Example 4, the detection circuit 30 further includes a filter 34 and an amplifier circuit 35 in addition to the configuration in Example 1. The other configurations are the same as those in Example 1, and thus detailed description thereof will be omitted.

The filter 34 is a filter that allows the signal in the second frequency band to pass therethrough and cuts off the signal in the first frequency band. Here, the filter 34 is a band pass filter that allows the signal in the second frequency band to pass therethrough, but may be a high pass filter, a low pass filter, a band elimination filter, or the like. The filter 34 is provided between the coupler 33 and the comparator 31a, and the leakage signal is input to the signal detection circuit (comparator 31a) via the filter 34.

Since the detection circuit 30 is connected to the path L1, it is necessary to prevent the loss from occurring in the signal in the first frequency band which is the main signal in the path L1. Correspondingly, the detection circuit 30 includes the filter 34 that allows the signal in the second frequency band to pass therethrough and cuts off the signal in the first frequency band. Therefore, the signal in the first frequency band is reflected by the filter 34 and is less likely to be input to the detection circuit 30. Accordingly, in the path L1, it is possible to suppress the occurrence of the loss and the noise due to the detection circuit 30 for the signal in the first frequency band which is the main signal. On the other hand, since the leakage signal in the second frequency band leaked to the path L1 passes through the filter 34, the signal detection circuit can effectively detect the leakage signal via the filter 34.

The amplifier circuit 35 is a circuit that amplifies the leakage signal, and is provided between the filter 34 and the comparator 31a, and the leakage signal is input to the signal detection circuit (comparator 31a) via the amplifier circuit 35. As a result, since the leakage signal can be amplified by the amplifier circuit 35, even when the leakage signal is minute, the detection accuracy of the signal detection circuit can be improved, and loss can be effectively compensated. Note that, when the comparator 31a is viewed from the path L1, the filter 34 and the amplifier circuit 35 are provided in the order of the filter 34 and the amplifier circuit 35, but the order in which they are provided may be reversed. Further, the configuration of the amplifier circuit 35 is not particularly limited as long as the circuit can amplify the signal in the second frequency band.

Figure 6:
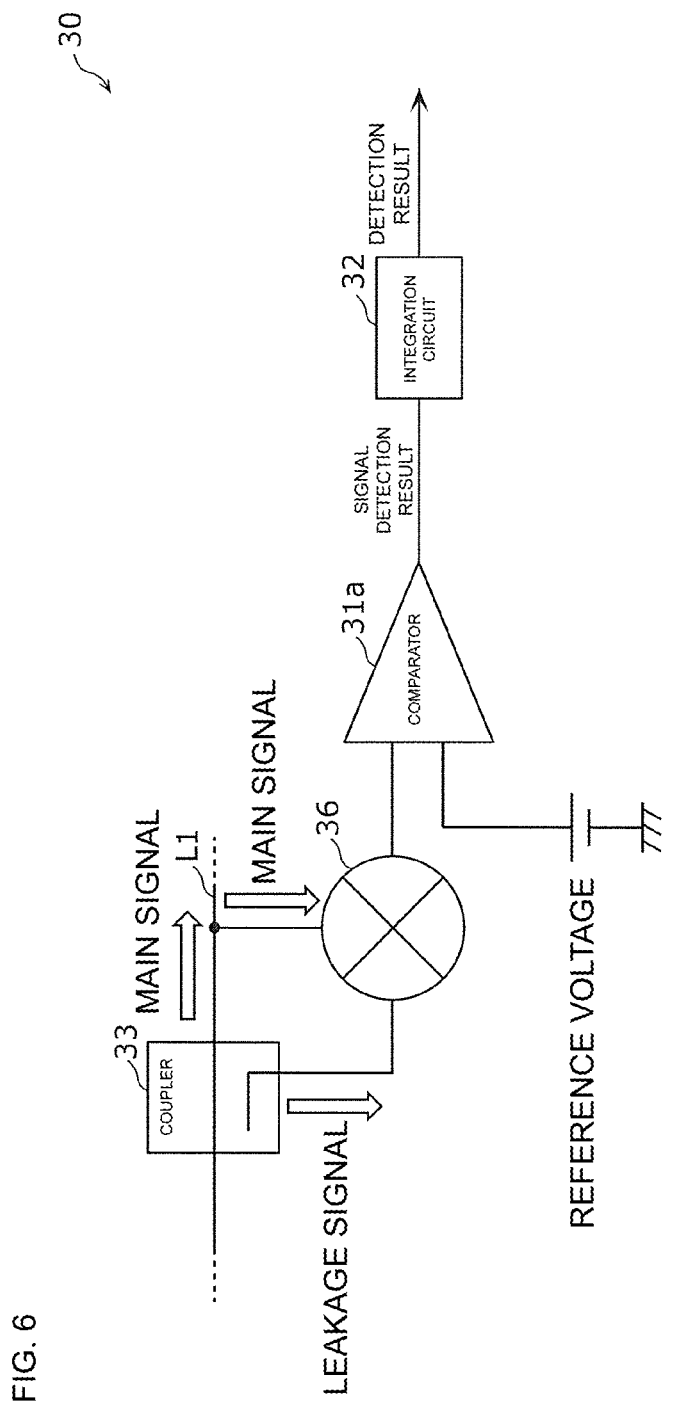
FIG. 6 is a configuration diagram illustrating Example 5 of the first detection circuit according to Embodiment 1.

Note that the detection circuit 30 may not include both the filter 34 and the amplifier circuit 35, or may have either one of the filter 34 and the amplifier circuit 35. For example, in a case that the comparator 31a has the frequency characteristics corresponding to the second frequency band and not corresponding to the first frequency band, even when the detection circuit 30 does not include the filter 34, the signal in the first frequency band is less likely to be input to the detection circuit 30. The frequency characteristics of the comparator 31a corresponding to the second frequency band and not corresponding to the first frequency band are response that react to the signal in the second frequency band and do not react to the signal in the first frequency band when comparing the voltage of the signal input to the comparator 31a. Accordingly, even when the detection circuit 30 does not include the filter 34, the signal in the first frequency band is less likely to be input to the detection circuit 30, and the occurrence of the loss and the noise due to the detection circuit can be suppressed in the path L1. Note that, by providing the filter 34 while the comparator 31a has the frequency characteristics that correspond to the second frequency band and do not correspond to the first frequency band, the signal in the first frequency band can be more effectively prevented from being input to the detection circuit 30. In addition, the comparator 31a may have a function of varying the frequency characteristics of the comparator 31a. As a result, a leakage signal in another frequency band different from the second frequency band can also be detected by the comparator, so that loss in the plurality of paths can be compensated by the one detection circuit 30. In FIGS. 6 and 7 below, examples in which the detection circuit 30 does not include the filter 34 or the amplifier circuit 35 will be described. However, one or both of the filter 34 and the amplifier circuit 35 may be included.

FIG. 6 is a configuration diagram illustrating Example 5 of the first detection circuit (detection circuit 30) according to Embodiment 1.

In Example 5, the detection circuit 30 further includes a mixer 36 in addition to the configuration in Example 2. The other configurations are the same as those in Example 2, and thus detailed description thereof will be omitted.

The mixer 36 is a circuit that mixes the leakage signal and the signal in the first frequency band passing through the path L1. For input two signals having different frequencies, the mixer 36 outputs signals of sum and difference frequencies of the two frequencies based on the heterodyne principle. Here, since the leakage signal in the second frequency band and the signal in the first frequency band are input to the mixer 36, for example, when the leakage signal is A sin α (A: the amplitude of the leakage signal, α: a value based on the frequency in the second frequency band), and the signal in the first frequency band is B sin β (B: the amplitude of the signal in the first frequency band, β: a value based on the frequency in the first frequency band), a signal represented by the following Equation 1 is output from the mixer 36.

$$A\sin\alpha \times B\sin\beta = \frac{A \times B}{2}(-\cos(\alpha+\beta) + \cos(\alpha-\beta)) \quad \text{(Equation 1)}$$

Therefore, the output from the mixer 36 includes $$\frac{A \times B}{2}(\cos(\alpha-\beta))$$

that is a signal in a lower frequency band than the frequency of the leakage signal and the frequency of the signal in the first frequency band. Although not illustrated in FIG. 6, by providing the filter 34 (such as a low pass filter) between the mixer 36 and the comparator 31a, the signal in the low frequency band can be easily separated from the output from the mixer 36, and the comparator 31a can detect the leakage signal based on the signal in the low frequency band. Accordingly, even when the first frequency band and the second frequency band are close to each other, the signal represented by the difference between the first frequency band and the second frequency band is output to the frequency band lower than the first frequency band and the second frequency band as one of the outputs of the mixer 36, and thus the detection of the leakage signal is facilitated. Therefore, the detection accuracy of the signal detection circuit is improved, and it is possible to effectively compensate the loss.

Figure 7:
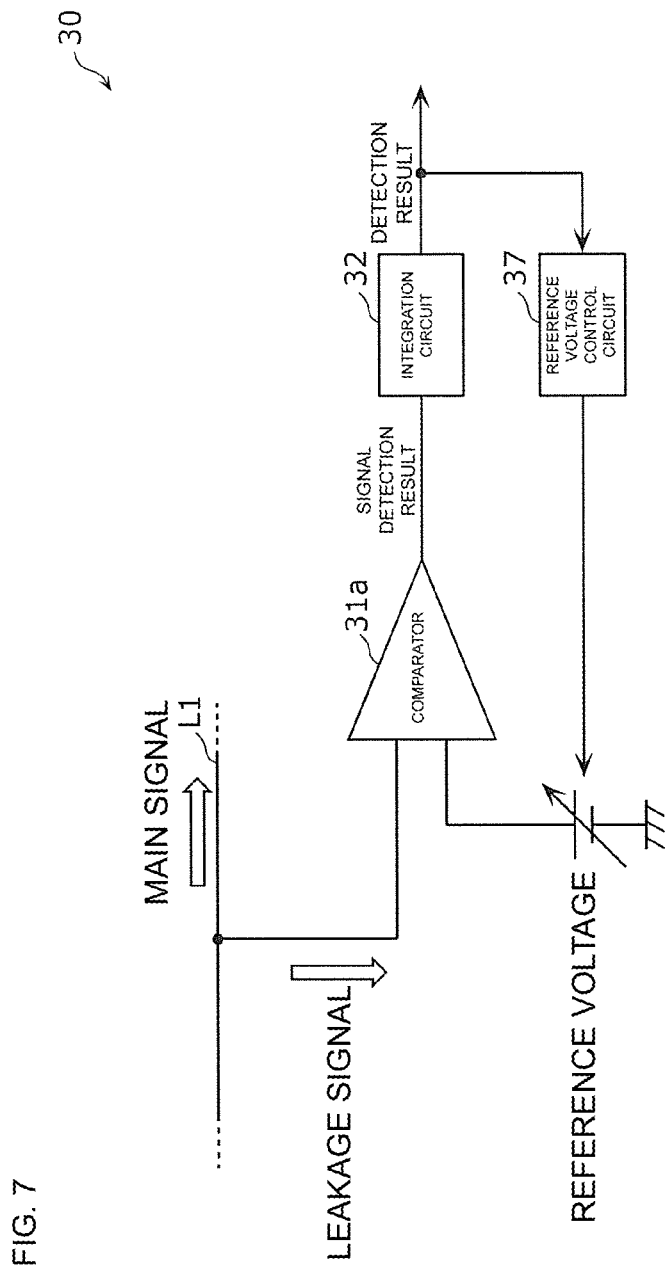
FIG. 7 is a configuration diagram illustrating Example 6 of the first detection circuit according to Embodiment 1.

FIG. 7 is a configuration diagram illustrating Example 6 of the first detection circuit (detection circuit 30) according to Embodiment 1.

In Example 6, the detection circuit 30 further includes a reference voltage control circuit 37 that controls the reference voltage in addition to the configuration in Example 1, and the reference voltage is variably controlled. The other configurations are the same as those in Example 1, and thus detailed description thereof will be omitted.

The reference voltage is variably controlled based on a comparison result output from the comparator 31a when the leakage signal is not input to the comparator 31a. For example, when the leakage signal is not input to the comparator 31a, the reference voltage control circuit 37 controls the reference voltage based on the comparison result output from the comparator 31a. Specifically, the reference voltage control circuit 37 is a feedback circuit that controls (determines) the reference voltage so that the signal indicating the comparison result output from the comparator 31a becomes zero when the leakage signal is not input to the comparator 31a. Accordingly, even when the reference voltage is shifted due to the environment, such as the temperature, the manufacturing variation, or the like, it is possible to correct deviation by controlling (calibrating or the like) the reference voltage. Therefore, the detection accuracy of the signal detection circuit is improved, and it is possible to effectively compensate the loss. For example, when the communication in the first frequency band and the communication in the second frequency band are not performed simultaneously (when CA is not performed), the leakage signal in the second frequency band is not input to the comparator 31a. Therefore, the reference voltage control circuit 37 controls the reference voltage so that the signal indicating the comparison result output from the comparator 31a becomes zero. Then, when CA is performed, the reference voltage control circuit 37 does not control the reference voltage, and the comparator 31a detects the leakage signal by using the reference voltage that is controlled (determined) when CA is not performed. Accordingly, for example, in the radio frequency module that performs CA, it is possible to correct the deviation of the reference voltage each time the CA is not performed. Therefore, the detection accuracy of the signal detection circuit is improved, and it is possible to effectively compensate the loss.

Note that the detection circuit 30 does not necessarily have to include the reference voltage control circuit 37. For example, the reference voltage may be variably controlled by a circuit outside the detection circuit 30.

3. Specific Examples of Amplifier Circuit

Next, specific examples of the amplifier circuits 20a and 20b will be described with reference to FIGS. 8 to 11. Here, the description will be given focusing on the amplifier circuit 20b controlled by the control circuit 40, but the amplifier circuit 20a has the same configuration as the amplifier circuit 20b, for example. By controlling the amplifier circuit 20b in response to the change in the signal amount in the second frequency band (the magnitude of the leakage signal leaking to the path L1), it is possible to compensate the loss due to the signal leakage to the path L1.

As described above, in order to compensate the loss due to the leakage of the signal in the second frequency band to the path L1, the amplifier circuit 20b provided in the path L2 is controlled. As specific methods for controlling the amplifier circuit 20b, there are a method for controlling the gain of the amplifier circuit 20b and a method for controlling the input impedance of the amplifier circuit 20b. By controlling the gain of the amplifier circuit 20b, it is possible to compensate the loss due to the signal leakage to the path L1. Also, by controlling the input impedance of the amplifier circuit 20b, it is possible to compensate the loss due to the signal leakage to the path L1. Further, since a noise figure (NF) in a first stage of the amplifier circuit 20b can be improved, it is possible to improve the NF of the entire radio frequency module 1 that is greatly affected by the NF in the first stage. First, the method for controlling the gain of the amplifier circuit 20b will be described with reference to FIGS. 8 to 10.

Figure 8:
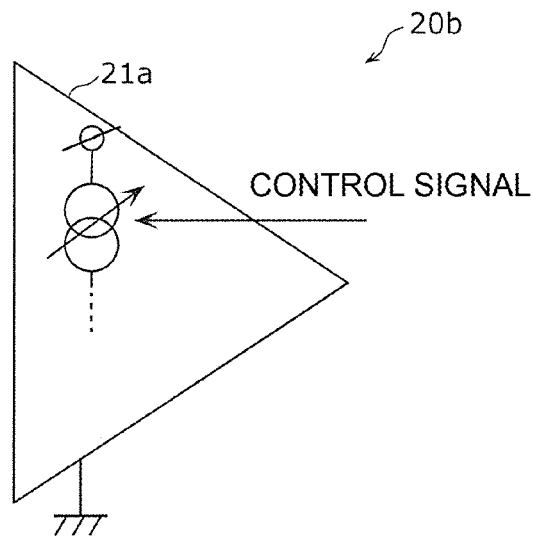
FIG. 8 is a configuration diagram illustrating Example 1 of a first amplifier circuit according to Embodiment 1.

FIG. 8 is a configuration diagram illustrating Example 1 of the first amplifier circuit (amplifier circuit 20b) according to Embodiment 1.

The amplifier circuit 20b is controlled based on the signal indicating the detection result output from the detection circuit 30. For example, the control circuit 40 acquires the signal indicating the detection result, generates a control signal from the signal indicating the detection result, and controls the amplifier circuit 20b based on the control signal. For example, when the gain of the amplifier circuit 20b is G, the gain G is represented by the following Equation 2. In Equation 2, ΔVout represents an output voltage of the amplifier circuit 20b, ΔVin represents an input voltage of the amplifier circuit 20b, ΔIout represents an output current of the amplifier circuit 20b, Rout represents a resistance value of a load included in the amplifier circuit 20b (load resistance value), and gm represents transconductance of the amplifier circuit 20b.

$$G=\Delta Vout/\Delta Vin=(\Delta Iout/\Delta Vin)\times Rout=gm\times Rout \quad \text{(Equation 2)}$$

In accordance with Equation 2, the gain G is proportional to the load resistance value Rout, and the proportionality constant at this time is the transconductance gm. It can be seen that the amplifier circuit having a large transconductance gm can obtain the higher gain G.

In accordance with Equation 2, by controlling the transconductance gm, it is possible to control the gain G. For example, the gain G of the amplifier circuit 20b is controlled based on the signal (control signal) indicating the detection result. As illustrated in FIG. 8, the amplifier circuit 20b is configured by an LNA 21a, the operation current (current source) of the LNA 21a is controlled, and thereby the gain G of the amplifier circuit 20b is controlled. This is because the transconductance gm indicates how easily the current flows in the amplifier circuit 20b, and changes in accordance with the operation current of the amplifier circuit 20b (LNA 21a). Therefore, the control circuit 40 controls the LNA 21a so as to change the operation current of the LNA 21a according to the signal indicating the detection result (that is, according to the magnitude of the leakage signal). Thereby, the transconductance gm of the amplifier circuit 20b is changed and the gain G is changed.

Figure 9:
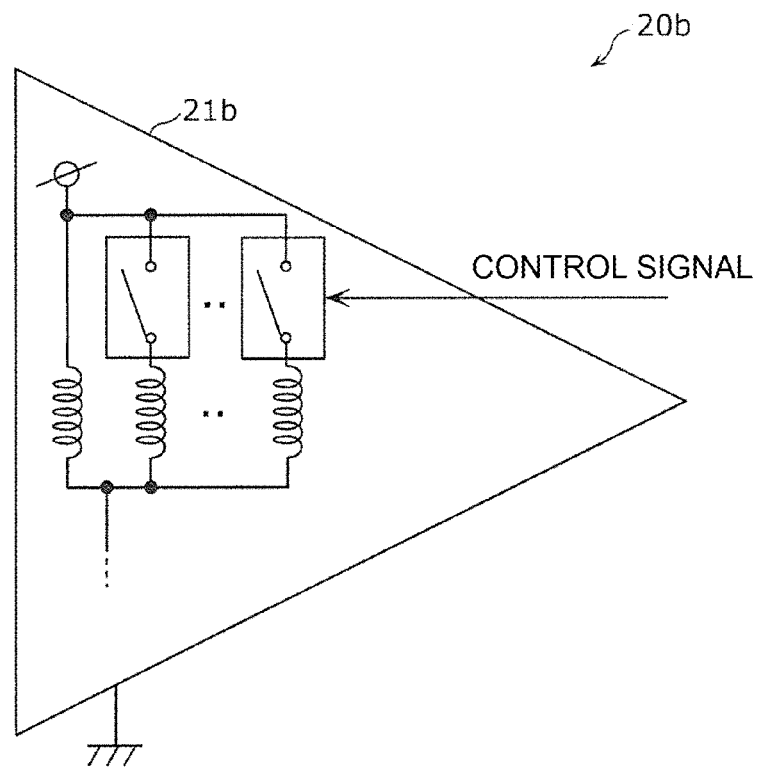
FIG. 9 is a configuration diagram illustrating Example 2 of the first amplifier circuit according to Embodiment 1.

FIG. 9 is a configuration diagram illustrating Example 2 of the first amplifier circuit (amplifier circuit 20b) according to Embodiment 1.

In accordance with Equation 2, it can be seen that the gain G can also be controlled by controlling the load resistance value Rout. As illustrated in FIG. 9, the amplifier circuit 20b is configured by an LNA 21b, the number of loads configuring the LNA 21b is controlled, and thereby the gain G of the amplifier circuit 20b is controlled. This is because the load resistance value Rout varies according to the number of loads (the number of loads connected in parallel with each other in this case). In FIG. 9, inductors are illustrated as the loads configuring the amplifier circuit 20b (LNA 21b), and switches connected in series to respective loads are illustrated as configurations for controlling the number of loads. Therefore, the control circuit 40 controls the LNA 21b so as to change the number of the effective loads according to the signal indicating the detection result (that is, according to the magnitude of the leakage signal). Specifically, the control circuit 40 switches on and off of the switches connected to the loads. Thereby, the load resistance value Rout of the amplifier circuit 20b is changed and the gain G is changed.

Figure 10:
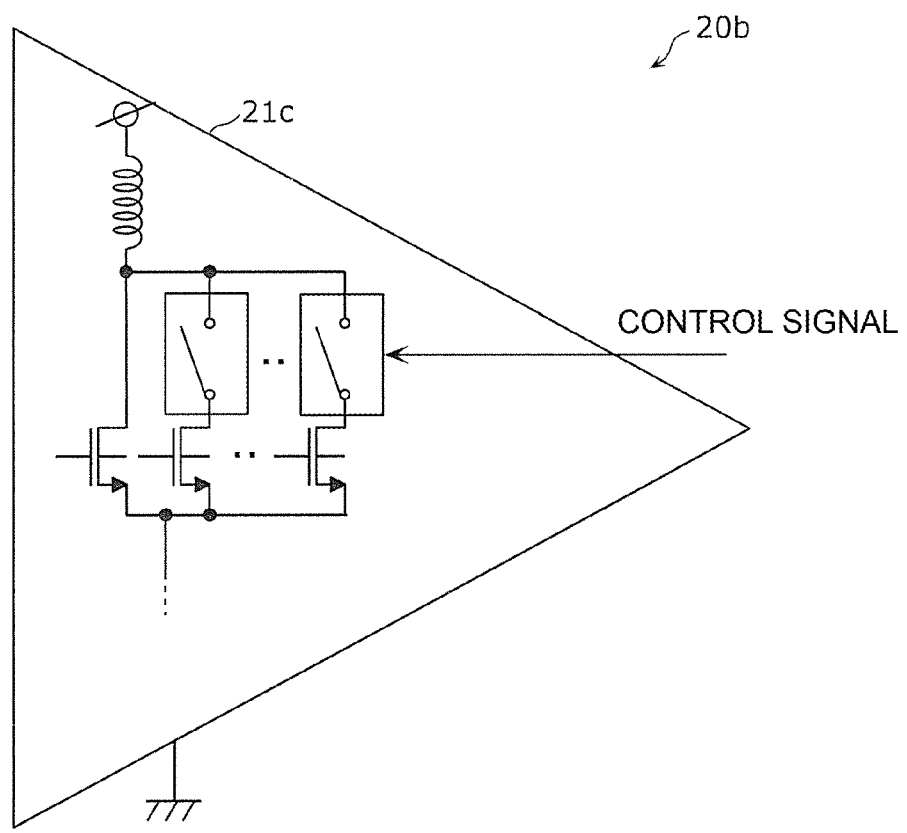
FIG. 10 is a configuration diagram illustrating Example 3 of the first amplifier circuit according to Embodiment 1.

FIG. 10 is a configuration diagram illustrating Example 3 of the first amplifier circuit (amplifier circuit 20b) according to Embodiment 1.

As illustrated in FIG. 10, the amplifier circuit 20b is configured by an LNA 21c, the number of transistors configuring the LNA 21c is controlled, and thereby the gain of the amplifier circuit 20b is controlled. This is because that the transconductance gm indicates how easily the current flows in the amplifier circuit 20b, and as illustrated in FIG. 10, the ease of current flow changes by changing the number of paths through which the current flows in accordance with the number of transistors connected in parallel with each other. Therefore, the control circuit 40 controls the LNA 21c so as to change the number of effective transistors (the number of paths through which the current flows) according to the signal indicating the detection result (that is, according to the magnitude of the leakage signal). Thereby, the transconductance gm of the amplifier circuit 20b is changed and the gain is changed.

Next, the method for controlling the input impedance of the amplifier circuit 20b will be described.

Figure 11:
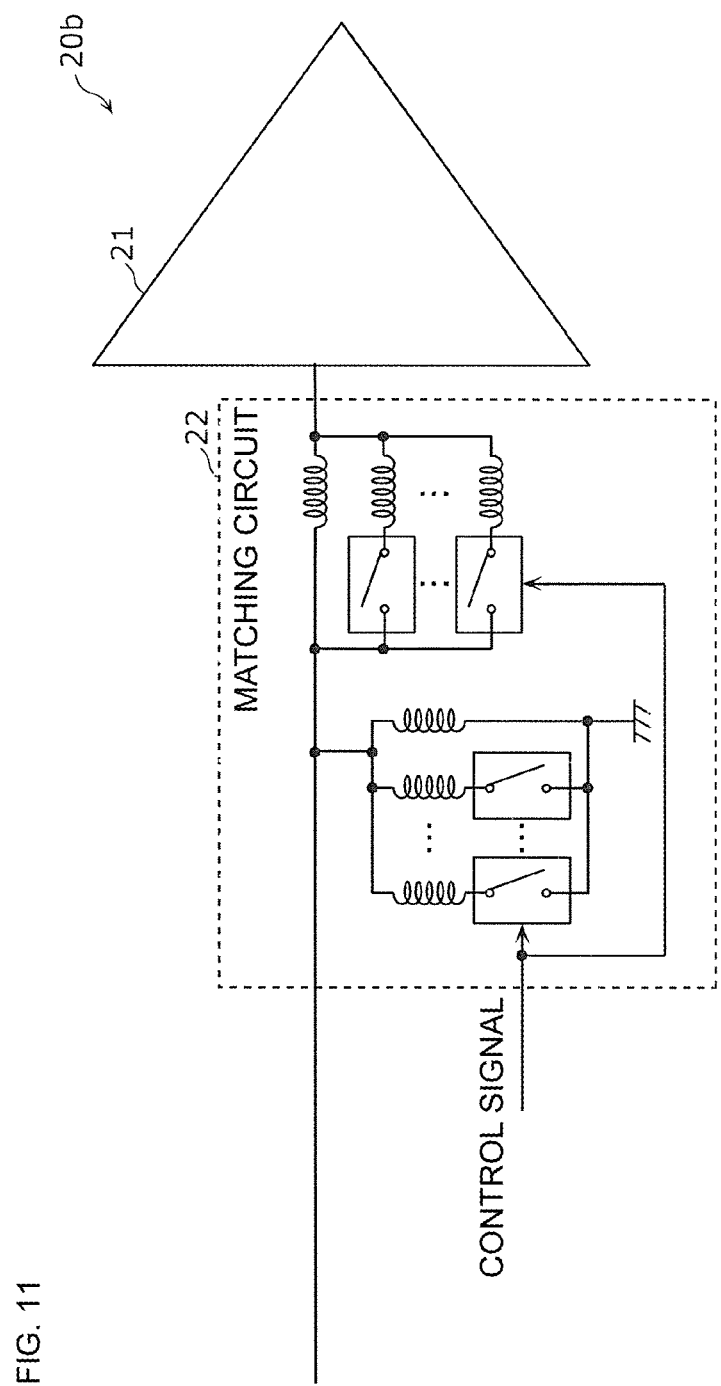
FIG. 11 is a configuration diagram illustrating Example 4 of the first amplifier circuit according to Embodiment 1.

FIG. 11 is a configuration diagram illustrating Example 4 of the first amplifier circuit (amplifier circuit 20b) according to Embodiment 1.

Ideally, the input impedance of an amplifier circuit is matched in a frequency band of a signal passing through a path in which the amplifier circuit is provided, and is open in other frequency bands except for the frequency band. However, for example, the signal in the second frequency band leaking to the path L1 means that the input impedance of the amplifier circuit 20b is not matched in the second frequency band. Therefore, by controlling the input impedance of the amplifier circuit 20b, it is possible to compensate the loss due to the signal leakage.

As illustrated in FIG. 11, the amplifier circuit 20b is configured by an LNA 21 and a matching circuit 22 provided in a previous stage (on the antenna element ANT side) of the LNA 21, the matching circuit 22 is controlled, and thereby the input impedance of the amplifier circuit 20b is controlled. The LNA 21 may be any of the LNAs 21a to 21c described above, or may be another LNA having no gain control function that the LNAs 21a to 21c have. The matching circuit 22 is configured by, for example, series inductors provided on the path in which the LNA 21 is arranged or in parallel with the path, and shunt inductors provided between the path in which the LNA 21 is arranged and the ground, but may be configured by other impedance elements (capacitors or the like). In addition, either the series inductors or the shunt inductors may not be provided.

The control circuit 40 controls the matching circuit 22 so as to change the number of series inductors and the number of shunt inductors according to the signal indicating the detection result (that is, according to the magnitude of the leakage signal). Specifically, the control circuit 40 switches on and off of a switch connected to each inductor. Thereby, the input impedance of the amplifier circuit 20b is changed.

Note that the control circuit 40 (for example, an AD conversion circuit) may be provided in the amplifier circuit 20b. In this case, the amplifier circuit 20b may acquire the signal indicating the detection result, and the control circuit 40 included in the amplifier circuit 20b may generate a control signal (digital signal) based on the signal indicating the detection result and may control the current source illustrated in FIG. 8 or the switches illustrated in FIGS. 9 to 11 based on the control signal. The radio frequency module 1 including the control circuit 40 allows the control circuit 40 to control the amplifier circuit 20b.

Embodiment 2

Next, a radio frequency module according to Embodiment 2 will be described with reference to FIG. 12.

Figure 12:
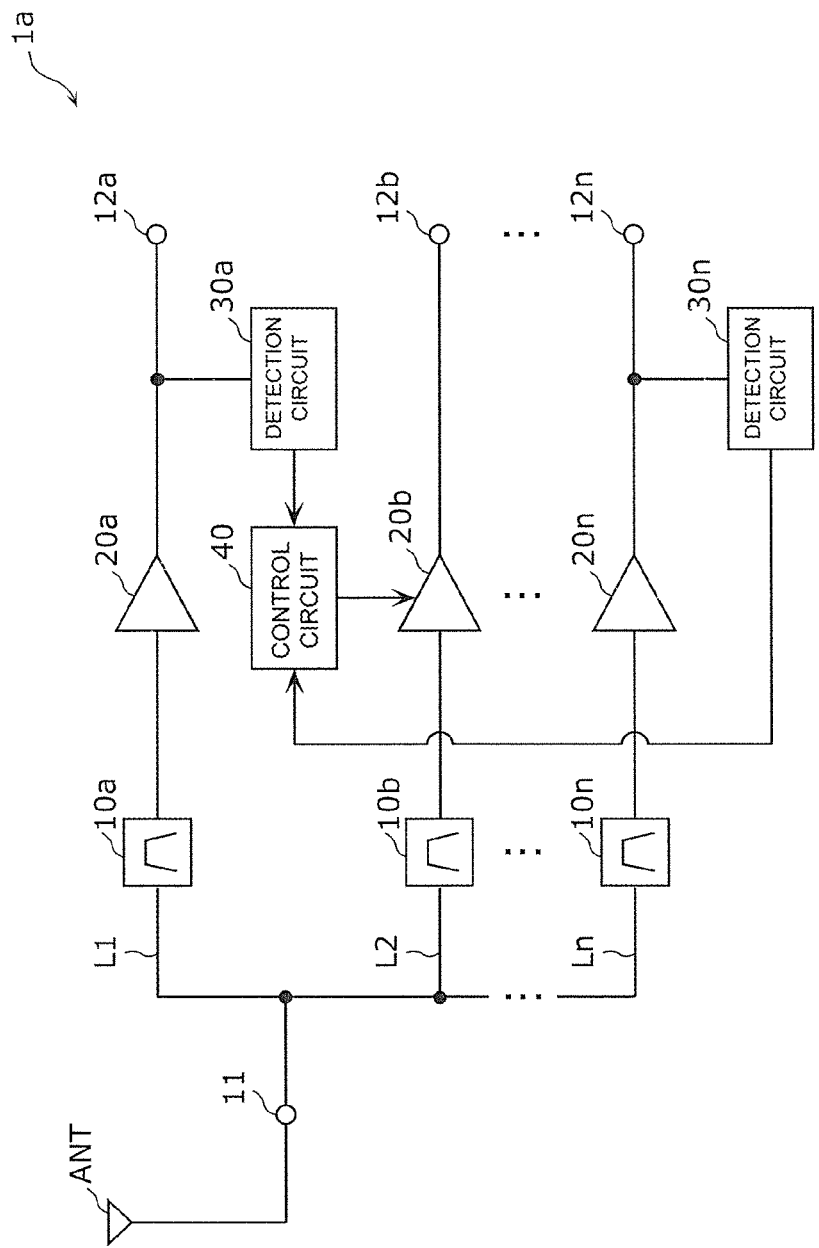
FIG. 12 is a configuration diagram illustrating a radio frequency module according to Embodiment 2.

FIG. 12 is a configuration diagram illustrating a radio frequency module 1a according to Embodiment 2. Note that FIG. 12 also illustrates the antenna element ANT in addition to the radio frequency module 1a.

In Embodiment 2, filters 10a to 10n are arranged on paths L1 to Ln connecting three or more input/output terminals 12a to 12n and the common terminal 11. The radio frequency module 1a is different from the radio frequency module 1 according to Embodiment 1 in that the radio frequency module 1a further includes one or more paths in addition to the two paths L1 and L2. The filter 10n and an amplifier circuit 20n are arranged in the path Ln, and a detection circuit 30n is connected to the path Ln. The other points are the same as those of the radio frequency module 1 according to Embodiment 1, and therefore, description thereof will be omitted. Note that the detection circuit 30a connected to the path L1 corresponds to the detection circuit 30 according to Embodiment 1. Further, for example, the input/output terminal 12n is a third input/output terminal, the path Ln is a third path, and the filter 10n is a third filter having a third frequency band different from the first frequency band and the second frequency band as a pass band. The filter 10n is a band pass filter configured by, for example, the acoustic wave filter, similar to the filters 10a and 10b. Note that the filter 10n is not limited to the acoustic wave filter, and may be another filter (such as an LC filter), and may be a low pass filter, a high pass filter, a band elimination filter, or the like without necessarily being limited to the band pass filter. In addition, among the paths L1 to Ln, there may be a path in which the filter or the amplifier circuit is not arranged.

In Embodiment 2, the detection circuit 30n is a circuit that selectively detects the leakage signal in the second frequency band leaked to the path Ln, and outputs a signal indicating a detection result. Note that the leakage signal in the second frequency band leaked to the path Ln refers to a signal in the second frequency band that should originally flow from the common terminal 11 to the path L2 but has entered the path Ln without necessarily flowing through the path L2. The detection circuit 30n has, for example, the same circuit configuration as the detection circuit 30 described with reference to FIGS. 2 to 7. The detection circuit 30n outputs the signal indicating the detection result to the control circuit 40 for controlling the amplifier circuit 20b provided in the path L2, for example. That is, the detection circuit 30n indirectly detects the change in the signal in the second frequency band in the path Ln instead of directly detecting the change in the signal in the second frequency band in the path L2 in the same manner as in the detection circuit 30a.

Specifically, the detection circuit 30n detects the change in the leakage signal in the second frequency band leaked to the path Ln. Therefore, the control circuit 40 controls the amplifier circuit 20b based on not only the leakage signal in the second frequency band in the path L1, but also the leakage signal in the second frequency band in the path Ln.

According to this configuration, since the respective detection results of the leakage signals in the second frequency band leaking to the plurality of paths can be used, the detection accuracy of the leakage signals (the signals that have not flowed to the path L2 and have entered the other paths) can be improved, and the compensation accuracy of the loss due to the leakage of the signals can be improved.

Embodiment 3

Next, a radio frequency module according to Embodiment 3 will be described with reference to FIG. 13.

Figure 13:
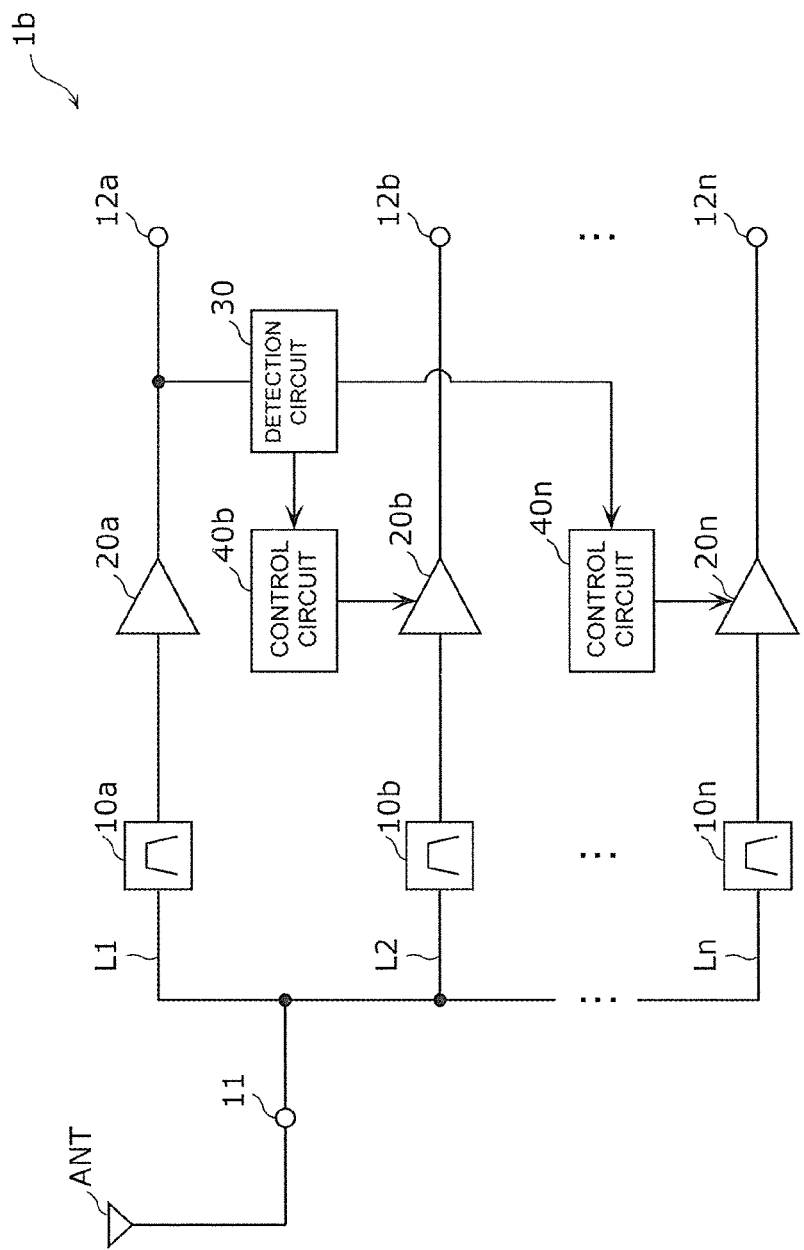
FIG. 13 is a configuration diagram illustrating a radio frequency module according to Embodiment 3.

FIG. 13 is a configuration diagram illustrating a radio frequency module 1b according to Embodiment 3. Note that FIG. 13 also illustrates the antenna element ANT in addition to the radio frequency module 1b.

In Embodiment 3, the filters 10a to 10n are arranged on the paths L1 to Ln connecting the three or more input/output terminals 12a to 12n and the common terminal 11. The radio frequency module 1b is different from the radio frequency module 1 according to Embodiment 1 in that the radio frequency module 1b further includes one or more paths in addition to the two paths L1 and L2. In the path Ln, the filter 10n and the amplifier circuit 20n are arranged, and a control circuit 40n for controlling the amplifier circuit 20n is provided. The other points are the same as those of the radio frequency module 1 according to Embodiment 1, and therefore, description thereof will be omitted. Note that the control circuit 40b that controls the amplifier circuit 20b corresponds to the control circuit 40 in Embodiment 1.

In Embodiment 3, the detection circuit 30 is a circuit that detects the leakage signal in the second frequency band leaked to the path L1 and the leakage signal in the third frequency band leaked to the path L1, and outputs the signals indicating the detection results. That is, in Embodiment 3, the detection circuit 30 is a circuit capable of detecting signals of a plurality of frequency bands different from each other. For example, when one of the second frequency band and the third frequency band is lower than the first frequency band and the other is higher than the first frequency band, the detection circuit 30 may have the filter 34 (band elimination filter) that cuts off the first frequency band and passes the second frequency band and the third frequency band. This is to prevent the signal in the first frequency band from being input to the detection circuit 30, and to detect the signal in the second frequency band and the signal in the third frequency band separately. The detection circuit 30 detects the signal in the second frequency band leaked to the path L1 and outputs the signal indicating the detection result to the control circuit 40b, and detects the signal in the third frequency band leaked to the path L1 and outputs the signal indicating the detection result to the control circuit 40n. Then, the control circuit 40b controls the amplifier circuit 20b based on the detection result of the leakage signal in the second frequency band to compensate the loss due to the signal leakage to the path L1, and the control circuit 40n controls the amplifier circuit 20n based on the detection result of the leakage signal in the third frequency band to compensate the loss due to the signal leakage to the path L1.

As described above, the one detection circuit 30 can compensate the loss due to the signal leakage not only in the path L2 but also in the plurality of paths.

Embodiment 4

Next, a radio frequency module according to Embodiment 4 will be described with reference to FIG. 14.

Figure 14:
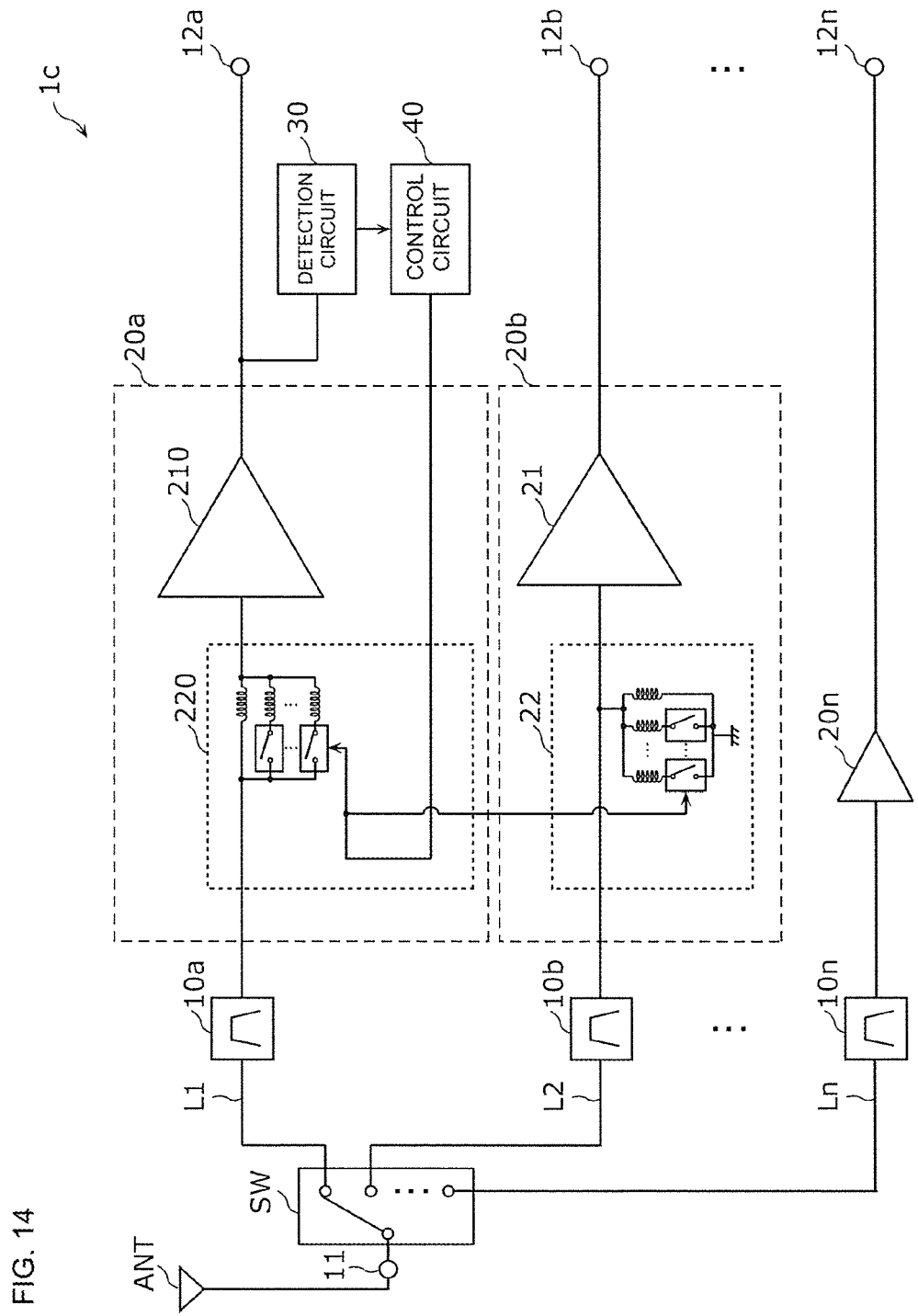
FIG. 14 is a configuration diagram illustrating a radio frequency module according to Embodiment 4.

FIG. 14 is a configuration diagram illustrating a radio frequency module 1c according to Embodiment 4. Note that FIG. 14 also illustrates the antenna element ANT in addition to the radio frequency module 1c.

In Embodiment 4, the filters 10a to 10n are arranged on the paths L1 to Ln connecting the three or more input/output terminals 12a to 12n and the common terminal 11. The radio frequency module 1c is different from the radio frequency module 1 according to Embodiment 1 in that the radio frequency module 1c further includes one or more paths in addition to the two paths L1 and L2. Note that, although not illustrated in the drawings in Embodiment 1 to 3, a switch SW for switching connection between the common terminal 11 (antenna element ANT) and each path is illustrated in FIG. 14. The switch SW connects the common terminal 11 and the one path or connects the common terminal 11 and the plurality of paths simultaneously. CA is performed by simultaneously connecting the common terminal 11 and the plurality of paths.

In Embodiment 4, the control circuit 40 controls not only the control of the amplifier circuit 20b (the control of the matching circuit 22 in this case), but also the input impedance of the amplifier circuit 20a based on the signal indicating the detection result of the detection circuit 30. Specifically, the control circuit 40 controls the input impedance of the amplifier circuit 20a by controlling a matching circuit 220 included in the amplifier circuit 20a. Note that an LNA 210 included in the amplifier circuit 20a may be any one of the LNAs 21a to 21c described above.

When the signal in the second frequency band leaks to the path L1, the input impedance of the amplifier circuit 20a cannot be in an open state in the second frequency band. Therefore, the control circuit 40 controls the matching circuits 22 and 220 based on the signal indicating the detection result of the detection circuit 30 so that in the path L1, the signal in the first frequency band is passed through and the signal in the second frequency band is reflected, and in the path L2, the signal in the first frequency band is reflected and the signal in the second frequency band is passed through.

Figure 15A:
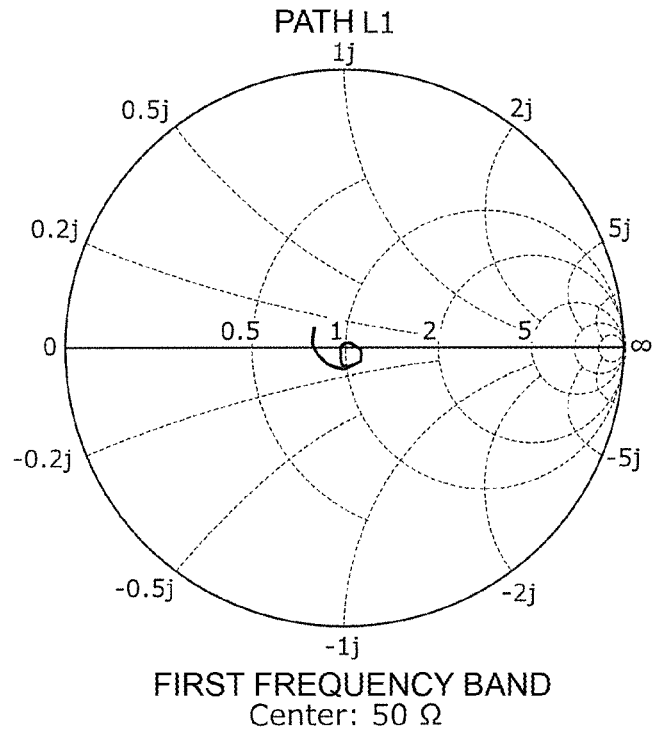
FIG. 15A is a Smith chart illustrating impedance characteristics in a first frequency band when a first path is viewed from a common terminal side.
Figure 15B:
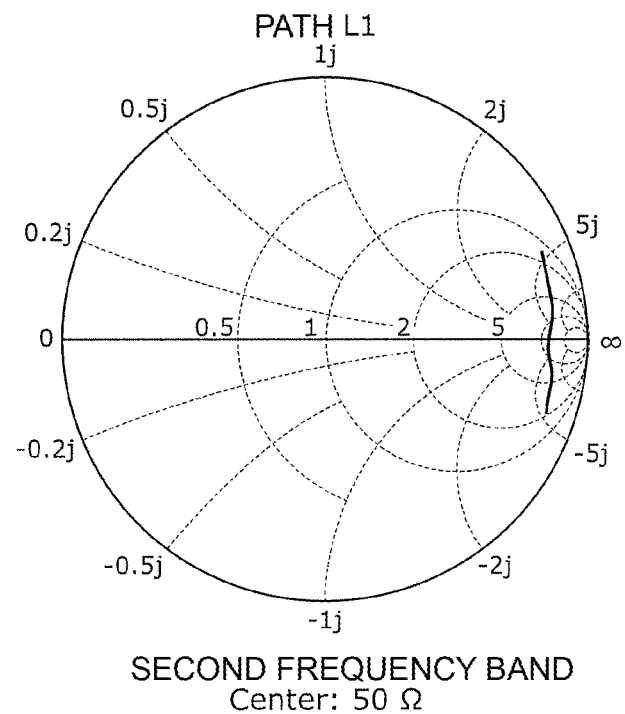
FIG. 15B is a Smith chart illustrating impedance characteristics in a second frequency band when the first path is viewed from the common terminal side.
Figure 16A:
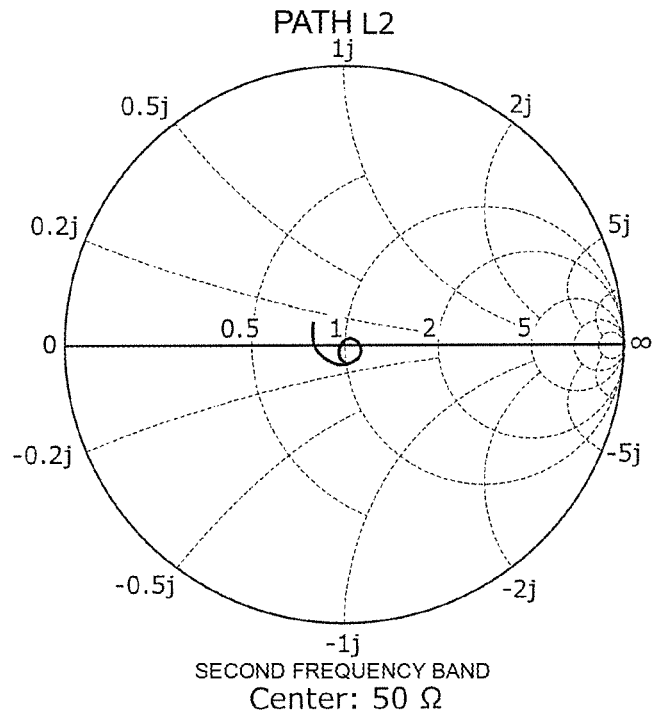
FIG. 16A is a Smith chart illustrating impedance characteristics in the second frequency band when a second path is viewed from the common terminal side.
Figure 16B:
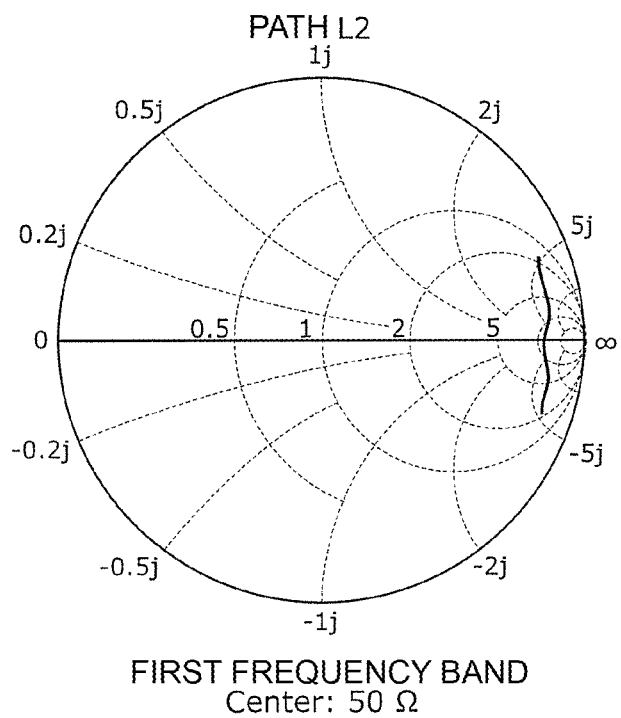
FIG. 16B is a Smith chart illustrating impedance characteristics in the first frequency band when the second path is viewed from the common terminal side.

FIG. 15A is a Smith chart illustrating impedance characteristics in the first frequency band when the first path (path L1) is viewed from the common terminal 11 side. FIG. 15B is a Smith chart illustrating impedance characteristics in the second frequency band when the first path (path L1) is viewed from the common terminal 11 side. FIG. 16A is a Smith chart illustrating impedance characteristics in the second frequency band when the second path (path L2) is viewed from the common terminal 11 side. FIG. 16B is a Smith chart illustrating impedance characteristics in the first frequency band when the second path (path L2) is viewed from the common terminal 11 side. Note that these Smith charts are normalized with 50Ω, for example. In addition, when measuring (simulating) the impedance characteristics, in order to ignore the influence from other paths, it is assumed that each path is disconnected.

As illustrated in FIG. 15A, it can be seen that the impedance characteristics in the first frequency band when the path L1 is viewed from the common terminal 11 are around 50 CI and matching is achieved by the control over the matching circuit 220. Thereby, in the path L1, the loss is less likely to occur in the main signal in the first frequency band. Further, as illustrated in FIG. 15B, it can be seen that the impedance characteristics in the second frequency band when the path L1 is viewed from the common terminal 11 are close to the open state by the control over the matching circuit 220. Thereby, the signal in the second frequency band is less likely to leak to the path L1, and the loss is less likely to occur in the main signal in the second frequency band in the path L2.

As illustrated in FIG. 16A, it can be seen that the impedance characteristics in the second frequency band when the path L2 is viewed from the common terminal 11 are around 50 CI and matching is achieved by the control over the matching circuit 22. Thereby, in the path L2, the loss is less likely to occur in the main signal in the second frequency band. Further, as illustrated in FIG. 16B, it can be seen that the impedance characteristics in the first frequency band when the path L2 is viewed from the common terminal 11 are close to the open state by the control over the matching circuit 22. Thereby, the signal in the first frequency band is less likely to leak to the path L2, and the loss is less likely to occur in the main signal in the first frequency band in the path L1.

As described above, not only the input impedance of the amplifier circuit 20b, but also the input impedance of the amplifier circuit 20a is controlled. Thereby, the signal is less likely to leak to the path L1, and the leakage signal to the path L2 can be reduced.

Note that the gain of the LNA 210 and the gain of LNA 21 may be controlled based on the detection result of the detection circuit 30. Accordingly, it is possible to compensate more effectively the loss due to the signal leakage.

Embodiment 5

The radio frequency modules described in Embodiments 1 to 4 may be applied to a communication device. Therefore, in the present embodiment, such a communication device will be described.

Figure 17:
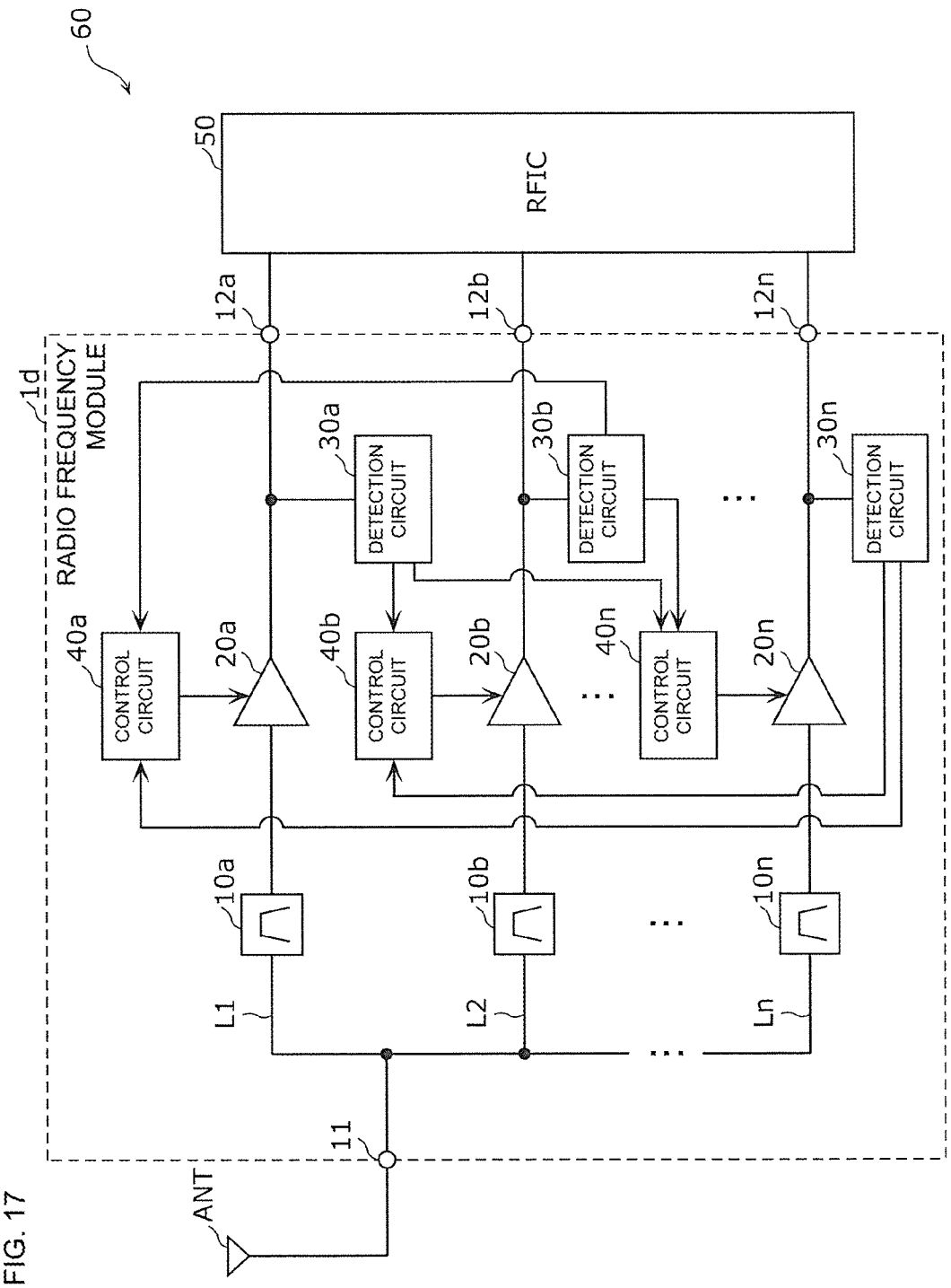
FIG. 17 is a configuration diagram illustrating a communication device according to Embodiment 5.

FIG. 17 is a configuration diagram illustrating a communication device 60 according to Embodiment 5. The communication device 60 includes the antenna element ANT, a radio frequency module 1d, and an RFIC 50. Note that the radio frequency module 1d applied to the communication device 60 in the present embodiment has three or more paths, and the respective paths are provided with the detection circuits 30a to 30n for detecting leakage signals of the frequency bands of the other paths and the control circuits 40a to 40n for controlling the amplifier circuits 20a to 20n of the respective own paths based on the leakage signals detected in the other paths.

For example, in the detection circuit 30a, in accordance with a pass band and an attenuation band of the filter 34 included in the detection circuit 30a and the frequency characteristics of the signal detection circuit (comparator 31a) included in the detection circuit 30a, the signal in the first frequency band, which is the main signal in the path L1, is prevented from being input to the detection circuit 30a, while detectable leakage signals are determined. For example, when the detection circuit 30a does not include the mixer 36, a leakage signal in a band far from the first frequency band is more likely to be detected. The leakage signals detectable by the detection circuits 30a to 30n are appropriately designed in accordance with the required specifications and the like.

In addition, among the paths L1 to Ln, there may be a path in which the detection circuit or the control circuit is not provided.

Further, the antenna element ANT is built in the communication device 60, but may be provided separately from the communication device 60.

The RFIC 50 is a circuit that processes radio frequency signals transmitted and received by the antenna element ANT. Specifically, the RFIC 50 performs signal processing on a radio frequency signal (a radio frequency received signal in this case) input from the antenna element ANT via the radio frequency module 1d by down-conversion or the like, and outputs a received signal generated by the signal processing to a baseband integrated circuit (BBIC). Note that the radio frequency module is for reception, but may be for transmission. In this case, the RFIC 50 performs signal processing on a transmission signal input from the baseband integrated circuit (BBIC) by up-conversion or the like, and outputs a radio frequency signal (a radio frequency transmission signal in this case) generated by performing the signal processing to the radio frequency module. Accordingly, it is possible to provide a communication device capable of suppressing the occurrence of loss and noise in one path when compensating loss due to signal leakage in the one path leaked to the other path out of a plurality of commonly connected paths.

Summary of Effects and the Like

As described above, the radio frequency module 1 includes the filter 10*a* that is arranged on the path L1 connecting the common terminal 11 and the input/output terminal 12*a* and has the first frequency band as the pass band, the filter 10*b* that is arranged on the path L2 connecting the common terminal 11 and the input/output terminal 12*b* and has the second frequency band different from the first frequency band, and the detection circuit 30 connected to the path L1 and configured to detect the leakage signal in the second frequency band leaked to the path L1, and output the signal indicating the detection result.

According to this configuration, it is possible to suppress the occurrence of the loss and the noise in the one path (path L2) when compensating the loss due to the signal leakage in the one path (path L2) leaked to the other path (path L1) out of a plurality of commonly connected paths.

Further, for example, the radio frequency module 1 may further include the amplifier circuit 20*b* arranged in the path L2, and the amplifier circuit 20*b* may be controlled based on the signal indicating the detection result.

According to this configuration, by controlling the amplifier circuit 20*b* in accordance with the change in the signal in the second frequency band (the magnitude of the leakage signal leaking to the path L1), it is possible to compensate the loss due to the signal leakage to the path L1.

Further, for example, the radio frequency module 1 may further include the control circuit 40 that controls the amplifier circuit 20*b* based on the signal indicating the detection result.

According to this configuration, the control circuit 40 can control the amplifier circuit 20*b*.

Further, for example, the gain of the amplifier circuit 20*b* may be controlled based on the signal indicating the detection result. Specifically, the gain of the amplifier circuit 20*b* may be controlled by control over the operation current of the amplifier circuit 20*b*, the number of loads included in the amplifier circuit 20*b*, or the number of transistors included in the amplifier circuit 20*b*, based on the signal indicating the detection result.

According to this configuration, by controlling the gain of the amplifier circuit 20*b*, it is possible to compensate the loss due to the signal leakage to the path L1.

Further, for example, the input impedance of the amplifier circuit 20*b* may be controlled based on the signal indicating the detection result.

According to this configuration, by controlling the input impedance of the amplifier circuit 20*b*, it is possible to compensate the loss due to the signal leakage to the path L1. Further, since the noise figure (NF) in the first stage of the amplifier circuit 20*b* can be improved, it is possible to improve the NF of the entire radio frequency module 1 that is greatly affected by the NF in the first stage.

Further, for example, the radio frequency module 1 may further include the amplifier circuit 20*a* arranged in the path L1, and the input impedance of the amplifier circuit 20*a* may be controlled based on the signal indicating the detection result.

According to this configuration, not only the input impedance of the amplifier circuit 20*b*, but also the input impedance of the amplifier circuit 20*a* is controlled. Thereby, the signal is less likely to leak to the path L1, and also the leakage signal to the path L2 can be reduced.

Further, for example, the detection circuit 30 may include the signal detection circuit to which the leakage signal is input and configured to detect the input leakage signal, and the integration circuit 32 that integrates the signal indicating the signal detection result in the signal detection circuit and outputs the signal obtained by integration as the signal indicating the detection result.

According to this configuration, the signal indicating the signal detection result in the signal detection circuit is integrated, so that the detection circuit 30 can output the direct current signal as the signal indicating the detection result. That is, since the signal indicating the detection result becomes the direct current signal and easy to process, it becomes easy to perform controlling by using the signal indicating the detection result (for example, the control of the amplifier circuit 20*b* by the control circuit 40).

Further, for example, the detection circuit 30 may further include the filter 34 that allows the leakage signal to pass therethrough and cuts off the signal in the first frequency band, and the leakage signal may be input to the signal detection circuit via the filter 34.

According to this configuration, the signal in the first frequency band is reflected by the filter 34, and is less likely to be input to the detection circuit 30. Therefore, it is possible to suppress the occurrence of the loss and the noise due to the detection circuit 30 for the signal in the first frequency band which is the main signal in the path L1. On the other hand, since the leakage signal in the second frequency band leaked to the path L1 passes through the filter 34, the signal detection circuit can effectively detect the leakage signal via the filter 34.

Further, for example, the detection circuit 30 may further include the amplifier circuit 35 that amplifies the leakage signal, and the leakage signal may be input to the signal detection circuit via the amplifier circuit 35.

According to this configuration, since the leakage signal can be amplified by the amplifier circuit 35, even when the leakage signal is minute, the detection accuracy of the signal detection circuit can be improved, and the loss can be effectively compensated.

Further, for example, the detection circuit 30 may further include the mixer 36 that mixes the leakage signal and the signal in the first frequency band, and the leakage signal may be input to the signal detection circuit via the mixer 36.

According to this configuration, even when the first frequency band and the second frequency band are close to each other, the signal represented by the difference between the first frequency band and the second frequency band is output to the frequency band lower than the first frequency band and the second frequency band as one of the outputs of the mixer 36, and thus the detection of the leakage signal is facilitated. Therefore, the detection accuracy of the signal detection circuit is improved, and it is possible to effectively compensate the loss.

Further, for example, the detection circuit 30 may further include the coupler 33 that extracts the leakage signal from the path L1, and the leakage signal extracted by the coupler 33 may be input to the signal detection circuit.

According to this configuration, the signal in the first frequency band is not extracted, and only the leakage signal is easily extracted by the coupler 33. Therefore, the signal detection circuit can easily detect the leakage signal. In addition, the signal in the first frequency band is less likely to be input to the detection circuit 30 due to the coupler 33.

Therefore, it is possible to suppress the occurrence of the loss and the noise due to the detection circuit 30 for the signal in the first frequency band which is the main signal in the path L1. That is, it is possible to suppress the occurrence of the loss in the signal in the first frequency band due to the detection circuit 30 connected to the path L1 for detecting the leakage signal in the second frequency band.

Further, for example, the signal detection circuit may be the comparator 31*a* to which the leakage signal and the reference voltage are input, and from which the signal indicating the comparison result between the voltage indicated by the leakage signal and the reference voltage is output as the signal indicating the signal detection result.

According to this configuration, by using the comparator 31*a*, it is possible to easily detect the leakage signal.

Further, for example, the comparator 31*a* may have the frequency characteristics that correspond to the second frequency band and do not correspond to the first frequency band.

According to this configuration, even when the detection circuit 30 does not include the filter 34, the signal in the first frequency band is less likely to be input to the detection circuit 30, and the occurrence of the loss and the noise due to the detection circuit can be suppressed in the path L1.

Further, for example, the comparator 31*a* may have the function of varying the frequency characteristics of the comparator 31*a*.

According to this configuration, the leakage signal in the other frequency band different from the second frequency band can also be detected by the comparator, so that the loss in the plurality of paths can be compensated by the one detection circuit 30.

Further, for example, the reference voltage may be variably controlled.

According to this configuration, even when the reference voltage is shifted due to the environment, such as the temperature, or the manufacturing variation, it is possible to correct the deviation by controlling (calibrating or the like) the reference voltage. Therefore, the detection accuracy of the signal detection circuit is improved, and it is possible to effectively compensate the loss.

Further, for example, the reference voltage may be variably controlled based on the comparison result output from the comparator 31*a* when the leakage signal is not input to the comparator 31*a*.

According to this configuration, for example, in the radio frequency module that performs CA, it is possible to correct the deviation of the reference voltage each time the CA is not performed. Therefore, the detection accuracy of the signal detection circuit is improved, and it is possible to effectively compensate the loss.

Further, for example, the signal detection circuit may be the rectifier circuit 31*b* that rectifies the input leakage signal and outputs the signal obtained by the rectification as the signal indicating the signal detection result.

According to this configuration, by using the rectifier circuit 31*b*, it is possible to easily detect the leakage signal. Further, since the rectifier circuit 31*b* is simply configured by diodes, loads, and the like, the signal detection circuit can be reduced in size.

Further, for example, the radio frequency module 1*a* may further include the filter 10*n* that is arranged on the path Ln connecting the common terminal 11 and the input/output terminal 12*n*, and has the third frequency band different from the first frequency band and the second frequency band as the pass band, and the detection circuit 30*n* that is connected to the path Ln, detects the leakage signal in the second frequency band leaked to the path Ln, and outputs the signal indicating the detection result.

According to this configuration, since the respective detection results of the leakage signals in the second frequency band leaking to the plurality of paths can be used, the detection accuracy of the leakage signals (the signals that have not flowed to the path L2 and have entered the other paths) can be improved, and the compensation accuracy of the loss due to the leakage of the signals can be improved.

Other Embodiments

The radio frequency module and the communication device according to the present disclosure have been described above with reference to the embodiments, but the present disclosure is not limited to the above embodiments. Other embodiments realized by combining any components in the above-described embodiments, modifications obtained by a person skilled in the art without necessarily departing from the spirit of the present disclosure with respect to the above embodiments, and various devices incorporating the radio frequency module according to the present disclosure are also included in the present disclosure.

For example, although the radio frequency module includes the amplifier circuits 20*a* and 20*b* in the above embodiments, the radio frequency module may not include the amplifier circuits 20*a* or 20*b*.

Further, for example, although the radio frequency module includes the control circuit 40 in the above embodiments, the radio frequency module may not include the control circuit 40.

INDUSTRIAL APPLICABILITY

The present disclosure is widely applicable to communication devices, such as mobile phones, as a radio frequency module applicable to a multi-band system.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio frequency module comprising:
    a first filter that is arranged on a first path connecting a common terminal and a first input/output terminal, the first filter having a first frequency band as a first pass band;
    a second filter that is arranged on a second path connecting the common terminal and a second input/output terminal, the second filter having a second frequency band different from the first frequency band as a second pass band;
    a first detection circuit connected to the first path and configured to detect a leakage signal in the second frequency band leaked to the first path and output a signal indicating a detection result; and
    a first amplifier circuit arranged in the second path,
    wherein the first amplifier circuit is controlled based on the signal indicating the detection result, and
    wherein an input impedance of the first amplifier circuit is controlled based on the signal indicating the detection result.

2. The radio frequency module according to claim 1, further comprising:
a control circuit configured to control the first amplifier circuit based on the signal indicating the detection result.

3. The radio frequency module according to claim 1, wherein a gain of the first amplifier circuit is controlled based on the signal indicating the detection result.

4. The radio frequency module according to claim 3, wherein the gain of the first amplifier circuit is controlled by control over an operation current of the first amplifier circuit, a number of loads included in the first amplifier circuit, or a number of transistors included in the first amplifier circuit, based on the signal indicating the detection result.

5. The radio frequency module according to claim 1, wherein the first detection circuit comprises:
a signal detection circuit to which the leakage signal is inputted and configured to detect the leakage signal that is inputted, and
an integration circuit configured to integrate a signal indicating a signal detection result in the signal detection circuit and output an integrated signal obtained by integration as the signal indicating the detection result.

6. The radio frequency module according to claim 5, wherein
the first detection circuit further includes a filter configured to pass a signal in the second frequency band and cut off a signal in the first frequency band, and
the leakage signal is inputted to the signal detection circuit via the filter.

7. The radio frequency module according to claim 5, wherein
the first detection circuit further includes a third amplifier circuit configured to amplify the leakage signal, and
the leakage signal is inputted to the signal detection circuit via the third amplifier circuit.

8. The radio frequency module according to claim 5, wherein
the first detection circuit further includes a coupler configured to extract the leakage signal from the first path, and
the leakage signal extracted by the coupler is inputted to the signal detection circuit.

9. The radio frequency module according to claim 5, wherein the signal detection circuit is a comparator to which the leakage signal and a reference voltage are inputted, and from which a signal indicating a comparison result between a voltage indicated by the leakage signal and the reference voltage is outputted as the signal indicating the signal detection result.

10. The radio frequency module according to claim 9, wherein the comparator has a frequency characteristics that correspond to the second frequency band and do not correspond to the first frequency band.

11. The radio frequency module according to claim 9, wherein the comparator has a function of varying frequency characteristics of the comparator.

12. The radio frequency module according to claim 9, wherein the reference voltage is variably controlled.

13. The radio frequency module according to claim 12, wherein the reference voltage is variably controlled based on a comparison result outputted from the comparator when the leakage signal is not inputted to the comparator.

14. The radio frequency module according to claim 5, wherein the signal detection circuit is a rectifier circuit configured to rectify the leakage signal that is inputted and output a signal obtained by rectification as the signal indicating the signal detection result.

15. The radio frequency module according to claim 1, further comprising:
a third filter that is arranged on a third path connecting the common terminal and a third input/output terminal, the third filter having a third frequency band different from the first frequency band and the second frequency band as a third pass band; and
a second detection circuit connected to the third path and configured to detect a leakage signal in the second frequency band leaked to the third path, and output a signal indicating a detection result.

16. A radio frequency module comprising:
a first filter that is arranged on a first path connecting a common terminal and a first input/output terminal, the first filter having a first frequency band as a first pass band;
a second filter that is arranged on a second path connecting the common terminal and a second input/output terminal, the second filter having a second frequency band different from the first frequency band as a second pass band;
a first detection circuit connected to the first path and configured to detect a leakage signal in the second frequency band leaked to the first path and output a signal indicating a detection result;
a first amplifier circuit arranged in the second path; and
a second amplifier circuit arranged in the first path,
wherein the first amplifier circuit is controlled based on the signal indicating the detection result, and
wherein an input impedance of the second amplifier circuit is controlled based on the signal indicating the detection result.

17. The radio frequency module according to claim 16, wherein the first amplifier circuit includes a matching circuit and the input impedance of the second amplifier circuit is controlled by controlling the matching circuit.

18. A radio frequency module comprising:
a first filter that is arranged on a first path connecting a common terminal and a first input/output terminal, the first filter having a first frequency band as a first pass band;
a second filter that is arranged on a second path connecting the common terminal and a second input/output terminal, the second filter having a second frequency band different from the first frequency band as a second pass band;
a first detection circuit connected to the first path and configured to detect a leakage signal in the second frequency band leaked to the first path and output a signal indicating a detection result,
wherein the first detection circuit comprises:
a signal detection circuit to which the leakage signal is inputted and configured to detect the leakage signal that is inputted,
an integration circuit configured to integrate a signal indicating a signal detection result in the signal detection circuit and output an integrated signal obtained by integration as the signal indicating the detection result, and
a mixer configured to mix the leakage signal and a signal in the first frequency band, and
wherein the leakage signal is inputted to the signal detection circuit via the mixer.

* * * * *

UNITED STATES PATENT AND TRADEMARK OFFICE
CERTIFICATE OF CORRECTION

PATENT NO. : 11,476,880 B2
APPLICATION NO. : 17/061093
DATED : October 18, 2022
INVENTOR(S) : Michiyo Yamamoto It is certified that error appears in the above-identified patent and that said Letters Patent is hereby corrected as shown below:

In the Specification

Column 15, Line 49, "CI" should be -- $\Omega$ --.

Column 15, Line 63, "CI" should be -- $\Omega$ --.

Signed and Sealed this
Fourth Day of July, 2023

Katherine Kelly Vidal
*Director of the United States Patent and Trademark Office*